United States Patent [19]

Nakayama et al.

[11] Patent Number: 4,990,411

[45] Date of Patent: Feb. 5, 1991

[54] COMPOUND SUPERCONDUCTING WIRE AND METHOD OF MANUFACTURING THE SAME

[75] Inventors: Shigeo Nakayama, Yokohama; Hachio Shiraki, Kawasaki; Satoru Murase, Yokohama; Keizo Shimamura, Kawasaki; Yoshiko Kohanawa, Yokohama, all of Japan

[73] Assignee: Kabushiki Kaisha Toshiba, Kawasaki, Japan

[21] Appl. No.: 363,720

[22] Filed: Jun. 9, 1989

[30] Foreign Application Priority Data

Jun. 9, 1988 [JP] Japan ................. 63-142616
Jan. 23, 1989 [JP] Japan ................. 1-13436

[51] Int. Cl.⁵ ................. H01B 12/00; H01L 39/24
[52] U.S. Cl. ................. 428/614; 29/599; 148/11.5 Q; 420/901; 428/930
[58] Field of Search ................. 428/930, 614; 420/901; 148/11.5 Q; 29/599

[56] References Cited

U.S. PATENT DOCUMENTS

| | | | |
|---|---|---|---|
| 4,171,464 | 10/1979 | Steyert, Jr. ................. | 148/11.5 Q |
| 4,205,119 | 5/1980 | Young et al. ................. | 428/930 |
| 4,501,062 | 2/1985 | Hillmann et al. ................. | 29/599 |
| 4,531,982 | 7/1985 | Dubots ................. | 29/599 |
| 4,652,697 | 3/1987 | Ando et al. ................. | 29/599 |
| 4,665,611 | 5/1987 | Sadakata et al. ................. | 29/599 |
| 4,752,654 | 6/1988 | Iida et al. ................. | 29/599 |
| 4,757,161 | 7/1988 | Wilhelm et al. ................. | 29/599 |
| 4,776,899 | 10/1988 | Murase et al. ................. | 148/11.5 Q |
| 4,803,310 | 2/1989 | Zeitlin et al. ................. | 29/599 |
| 4,863,804 | 9/1989 | Whitlow et al. ................. | 29/599 |

FOREIGN PATENT DOCUMENTS

| | | | |
|---|---|---|---|
| 56-141107 | 11/1981 | Japan . | |
| 61-264609 | 11/1986 | Japan . | |
| 63-53811 | 3/1988 | Japan . | |
| 2078786 | 1/1982 | United Kingdom ................. | 29/599 |

*Primary Examiner*—Upendra Roy
*Attorney, Agent, or Firm*—Oblon, Spivak, McClelland, Maier & Neustadt

[57] ABSTRACT

A composite member is prepared which comprises a core which will have a compound superconducting layer when heat-treated, and a stock for forming a stabilizing member made of copper and surrounding the core. The composite member is heat-treated in an oxidizing atmosphere, thus forming a copper-oxide thin layer on the surface of the stock. Thereafter, the composite member is heat-treated in a non-oxidizing atmosphere or in an atmosphere having an oxygen partial pressure which is too low to allow the forming of copper oxide. As a result, a compound superconducting wire is made which comprises a member including a compound superconductor, a diffusion-preventing layer made of oxide and surrounding the member, and a stabilizing member made of copper and surrounding the layer.

26 Claims, 11 Drawing Sheets

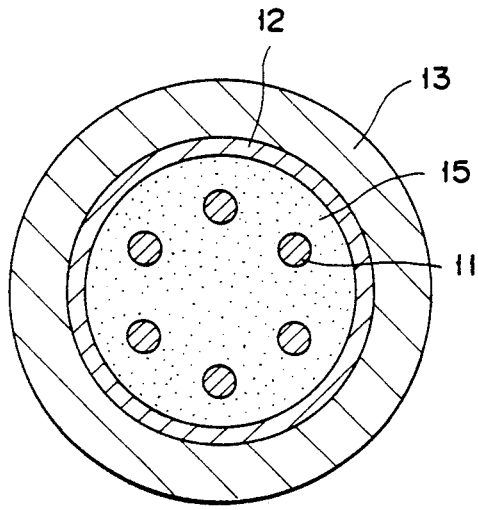
F I G. 5
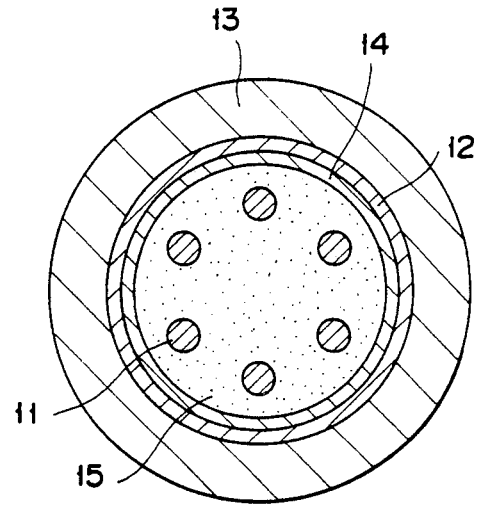
F I G. 6
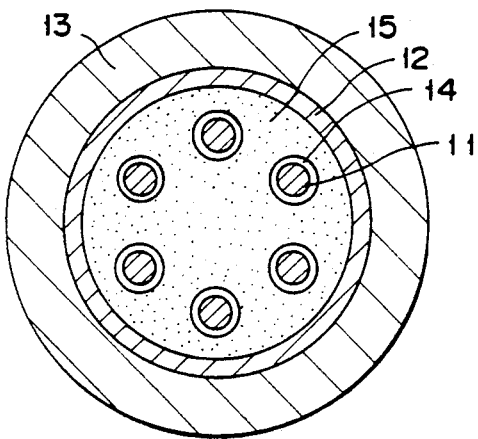
F I G. 7
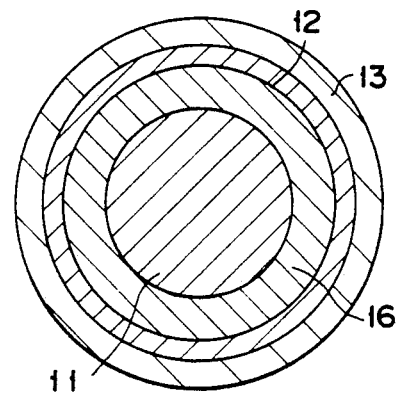
F I G. 8

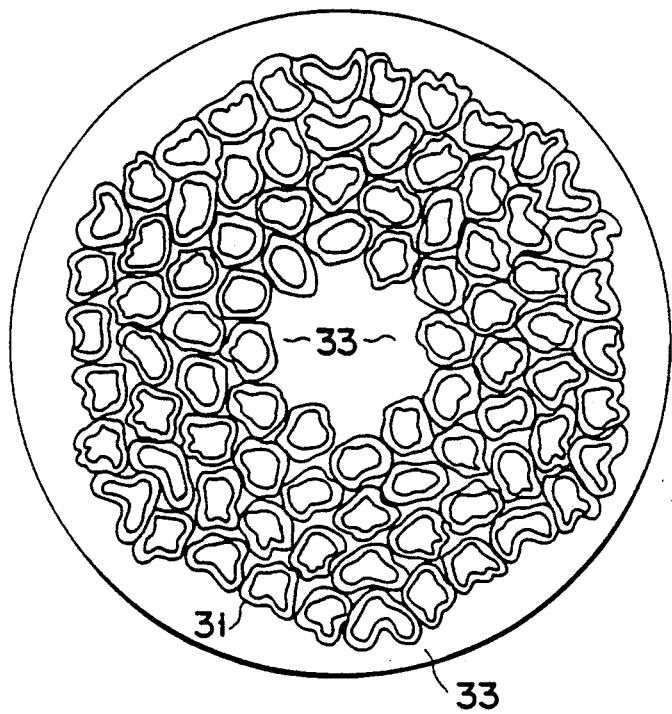
F I G. 12A
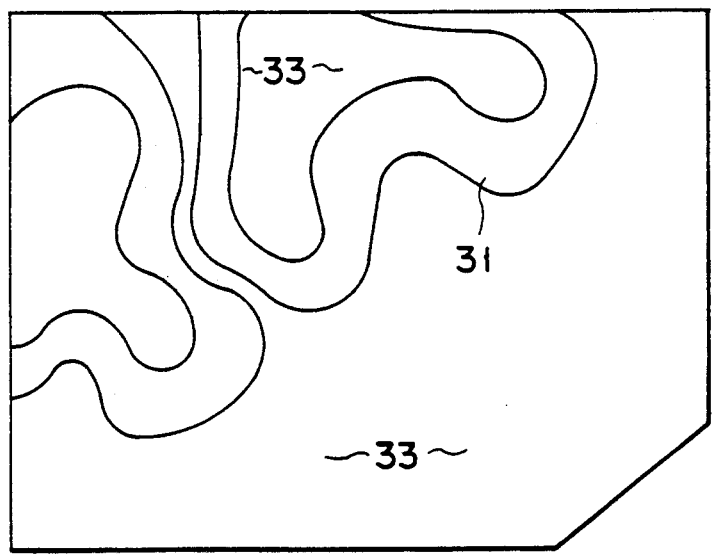
F I G. 12B

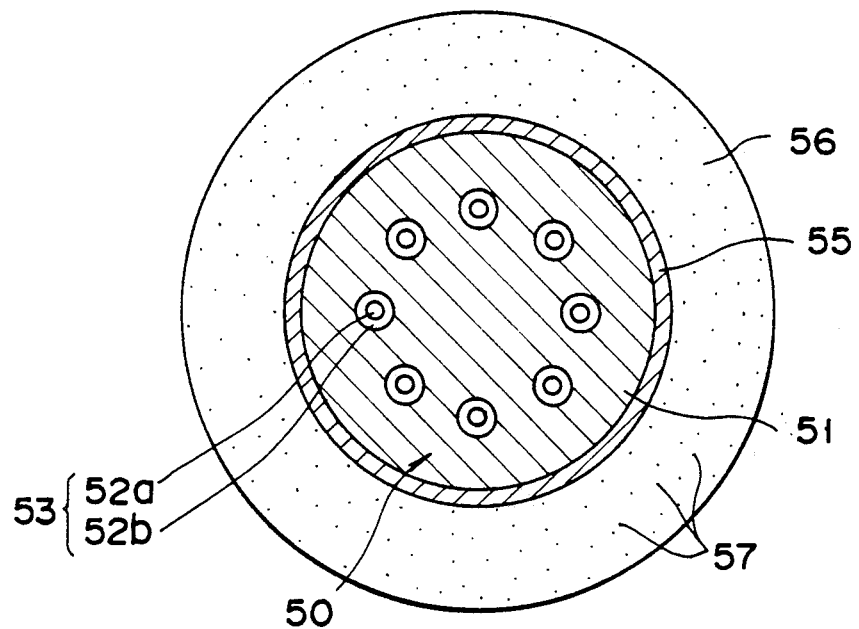
F I G. 15
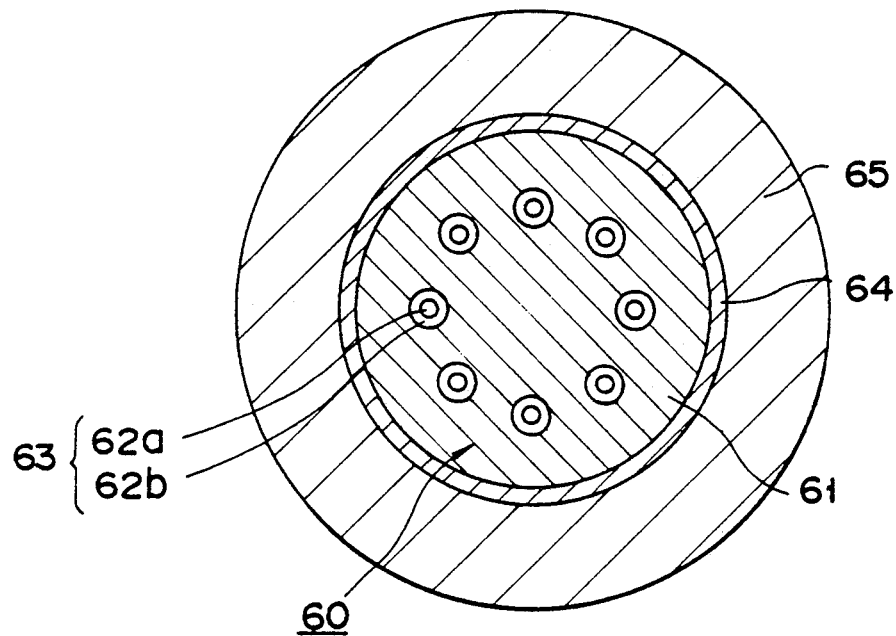
F I G. 17

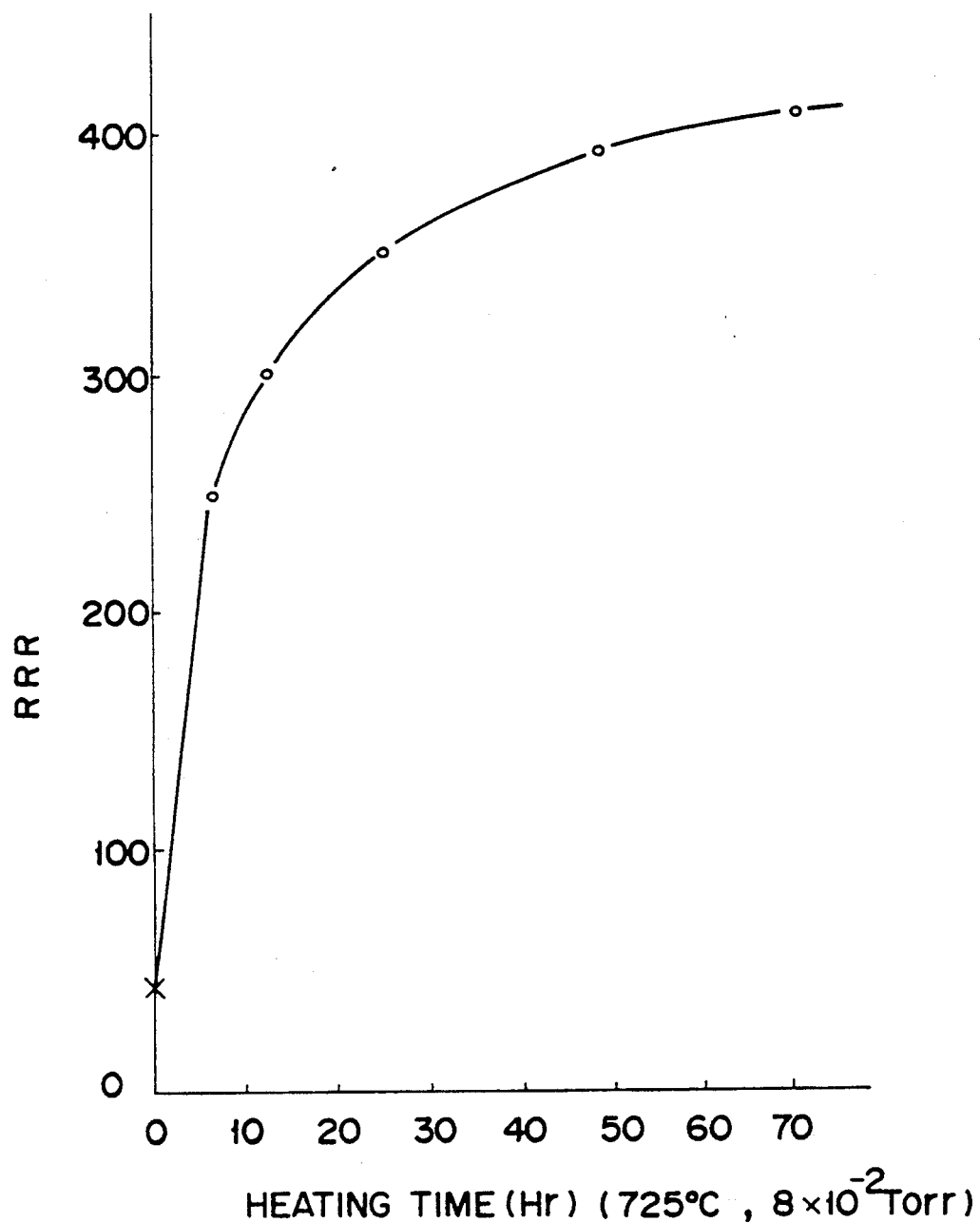
F I G. 16

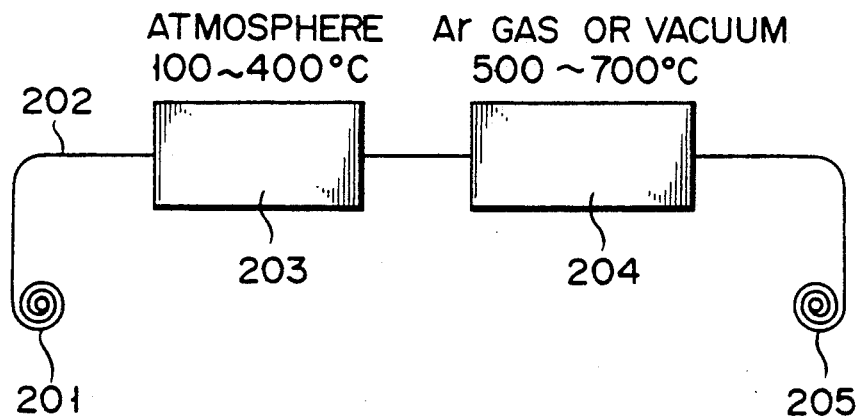
F I G. 22
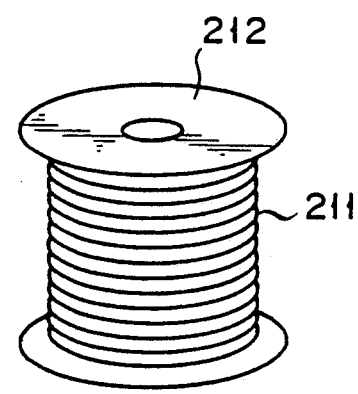
F I G. 23

COMPOUND SUPERCONDUCTING WIRE AND METHOD OF MANUFACTURING THE SAME

BACKGROUND OF THE INVENTION

1. Field of the Invention

The present invention relates to a compound superconducting wire comprising a core including compound superconducting material such as $Nb_3Sn$, a diffusion-preventing layer surrounding the core wire, and a stabilizing layer surrounding the diffusion-preventing layer and made of stabilizing material such as Cu, which has a high electrical conductivity, said diffusion-preventing layer preventing the elements of the compound superconducting material from diffusing into the stabilizing material. The invention also relates to a method of manufacturing the compound superconducting wire.

2. Description of the Related Art

Various compound superconducting wires are known, among which is an $Nb_3Sn$ multi filamentary superconducting wire. This multi filamentary superconducting wire is manufacture in the following way. First, an Sn wire is inserted into a Cu tube. The Sn wire and the Cu tube are inserted into an Nb tube. The Sn wire, the Cu tube, and the Nb tube are inserted into a Cu tube. The Sn wire, the Cu tubes, and the Nb tube are stacked together and subjected to reduction of area by means of a swaging machine, and/or a drawing machine into a rod having a regularly hexagonal cross section. This rod and some other identical rods made by the same method are inserted into a Cu tube used as a stabilizing tube. The rods and the Cu tube are stacked together and subjected to reduction of area by means of a hydrostatic extrusion machine and the drawing machine into a wire. This wire is heat-treated, whereby each Sn wire and the Cu tube surrounding the Sn wire are alloyed together, and the tin (Sn) in this alloy reacts with the Nb tube surrounding the Cu tube, forming a $Nb_3Sn$ superconducting layer on the Nb tube. Thus, a compound, multi filamentary superconducting wire is manufactured.

FIG. 1 is a sectional view of such a multi filamentary superconducting wire. As this figure shows, this superconducting wire includes six rods embedded in a Cu rod 4 as a stabilizing member. Each of the rods comprises a Cu-Sn core 1, an $Nb_3Sn$ layer 2 surrounding the core 1, and a diffusion-preventing layer 3 made of Nb and surrounding the $Nb_3Sn$ layer 2. The stabilizing member allows a fast passage of an electrical current when the $Nb_3Sn$ 2 undergoes transition, from superconducting state to normally conducting state, thereby protecting the tube 2 against burning damages and maintaining the $Nb_3Sn$ layer stable.

Copper (Cu) which is used as the material of the stabilizing member 4 has an very high residual resistance ratio (RRR) of 200 to 800; its low resistivity $\rho$ is about $1 \times 10^{-8}[\Omega \cdot cm]$ at 20[K]. To make matters worse, the electrical resistance of Cu decreases when Sn of the Cu-Sn core 1 diffuses into the stabilizing rod 4 during the heat treatment.

The diffusion-preventing tube 3 prevents Sn from diffusing into the rod 4 indeed, but cannot completely prevent Sn from diffusing into the rod 4 during the heat treatment. No measures are taken to prevent niobium (Nb), i.e., the material of the tube 3, from diffusing into the stabilizing rod 4. In the case where $Nb_3Sn$, i.e., the material of the tube 2, contains titanium (Ti) or tantalum (Ta), Ti or Ta inevitably diffuses into the rod 4 during the heat treatment. When Nb, Ti, or Sn diffused into the stabilizing rod 4, the RRR of the rod 4 decreases to 1 to 20, and the resistivity $\rho$ of the rod 4 is about $1 \times 10^{-7}$ to about $1 \times 10^{-6}[\Omega \cdot cm]$ at 20[K]. That is, the copper (Cu) into which Nb, Ti, Ta or Sn has diffused has electric resistivity about ten to hundred times higher than that of pure copper. As the result of this stability of the compound superconducting wire is reduced.

To suppress the diffusion of impurities into the stabilizing member 4, the unfinished product is heat-treated at low temperatures and for a relatively short time. However, when the temperature and time of the heat treatment are reduced, however, the formation of the $Nb_3Sn$ layer 2 is impaired, resulting in a superconducting wire whose critical current density is insufficient.

The superconducting wire, whose stabilizing member 4 is made of Cu, is disadvantageous for its low mechanical strength Generally, the wire is strengthened by a tension member made of stainless steel It requires a complex process to assemble the wire and the tension member into one composite member. The manufacture cost of this composite member is high, and the space factor of this member is low.

SUMMARY OF THE INVENTION

Accordingly, the first object of the present invention is to provide a compound superconducting wire whose stabilizing member has a low electrical resistivity, and also a method of manufacturing the compound superconducting wire.

The second object of the invention is to provide a compound superconducting wire whose stabilizing member has not only a low electrical resistivity but also a sufficient mechanical strength, and also to provide a method of manufacturing the compound superconducting wire.

According to a first aspect of the invention, there is provided a compound superconducting wire comprising a superconducting member including a compound superconductor; a stabilizing member made of mainly copper; and a diffusion-preventing layer containing metal oxide and located between said superconducting member and said stabilizing member.

According to a second aspect of the invention, there is provided a compound superconducting wire comprising a superconducting member including compound superconductor; a stabilizing member made of mainly strengthened copper; and a diffusion-preventing layer located between said superconducting member and said stabilizing member, and comprising a plurality of layers, at least the outermost layer being a metal oxide layer.

According to a third aspect of the invention, there is provided a compound superconducting wire comprising a superconducting member including a compound superconductor; a stabilizing member made of mainly copper; a diffusion-preventing layer containing metal oxide and located between said superconducting member and said stabilizing member; and a strengthened copper-alloy layer located between said diffusion-preventing layer and superconducting member.

According to a fourth aspect of the invention, there is provided a method of manufacturing a compound superconducting wire which has a superconducting member including a compound superconductor, and a stabilizing member provided on the superconducting member, said method comprising the steps of: preparing a composite member comprising a superconductorforming member including a compound superconductor or a material which becomes a compound superconductor when heat-treated, and a stock for forming said stabilizing member by a heat-treatment, made of mainly copper and stacked together with said superconductor-forming member; forming a copper oxide layer on the surface of said stock; and heat-treating the composite member in a nonoxidizing atmosphere or in an atmosphere having an oxygen partial pressure which is too low to allow the forming of copper oxide.

According to a fifth aspect of the invention, there is provided a method which is similar to the method according to the fourth aspect of the invention, but the stabilizing member is made of a copper alloy containing 0.1 to 2 percent by weight of at least one element selected from the group consisting of A , Ti, Zr, Mg, Cr, Nb, and Ni.

According to a sixth aspect of the invention, there is provided a method which is similar to the method according to the fourth aspect of the invention, but the composite member is preliminarily heat-treated, thereby diffusing the element contained in the superconductor forming member into the stock in an amount ranging from 0.1 to 2 percent by weight, and also forming a thin copper oxide layer on the outer surface of the stock, and the composite member is heat-treated in a non-oxidizing atmosphere or in an atmosphere having an oxygen partial pressure which is lower than that at which the thin copper oxide layer has been formed on the outer surface of the stabilizing member.

According to the seventh aspect of the invention, there is provided a method which is similar to the method according to the fourth aspect of the invention, but the stock is a two-layered one which comprises a pure copper tube and a strengthened copper-alloy tube.

BRIEF DESCRIPTION OF THE DRAWINGS

FIGS. 2 to 8 are cross-sectional views illustrating compound superconducting wires according to the embodiments of the present invention;

FIG. 12A is a cross-sectional view showing a control for comparison with the compound superconducting wire shown in FIG. 11A;

FIG. 12B is an enlarged view showing part of that control illustrated in FIG. 12A;

FIGS. 14 and 15 are cross-sectional views showing two other examples of the compound superconducting wires according to the present invention;

FIG. 16 is a graph representing the relationship between the RRR of a compound superconducting wire of the invention and the heat-treatment temperature, the oxide thin layer and superconducting layer of said wire having formed simultaneously;

FIGS. 17 and 18 are cross-sectional views illustrating two other examples of the compound superconducting wires according to the invention;

FIG. 22 is a diagram explaining a method of diffusing oxygen into copper which is the material of the stabilizing member of the compound superconducting wire according to the invention; and FIG. 23 is a diagram explaining another method of diffusing oxygen into copper which is the material of the stabilizing member of the compound superconducting wire according to the invention.

DETAILED DESCRIPTION OF THE PREFERRED EMBODIMENTS

The present invention will now be described in detail, with reference to several embodiments.

Figure 2:
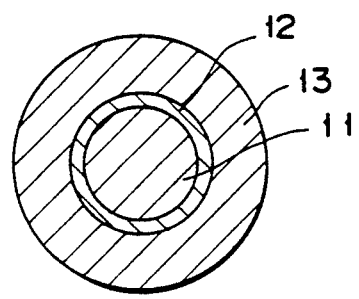

FIG. 2 is a cross-sectional view showing a compound superconducting wire according to an embodiment of the present invention. As this figure shows, the wire comprises a core 11 including compound superconductor, a first diffusion-preventing layer 12 made of metal oxide and surrounding the core 11, and a tube-like stabilizing member 13 surrounding the diffusion-preventing layer 12.

The core 11 can be formed of a compound superconductor only, or can comprise a core 11A of an element of compound superconductor or an alloy containing this element, and a layer 11b made of the compound superconductor surrounding the core 11a. The compound superconductor is, for example, $Nb_3Sn$, $Nb_3A$ , $Nb_3Ge$, $Nb_3(A ,Ge)$, $V_3Ga$, or the like. These compound superconductors have a critical temperature (Tc) of about 20K, which is higher than that of an alloy superconductor.

The stabilizing member 13 is a member for allowing an electrical current to pass fast through it when the core 11 undergoes transition, from superconducting state to normally conducting state, thereby protecting the core 11 against burning damages and maintain the superconductor of the core 11 stable. Hence, the member 13 is made mainly of copper (Cu) which has a high electrical conductivity. It can be made of pure copper having an extremely high conductivity, or a strengthened Cu alloy such as a solid-solution strengthened Cu alloy or a dispersion-strengthened Cu alloy.

A strengthened Cu alloy can be used which comprises a Cu matrix and 0.1 to 2 wt % of one element selected from the group consisting of A , Ti, Zr, Mg, Cr, Nb, and Ni. When A is used as the element, the alloy is a dispersion-strengthened Cu alloy having a dispersion phase of A or $A_2O_3$. When an element of compound superconductor such as Sn is contained in an amount of 0.1 to 2.0 wt % to a Cu matrix, a dispersion-strengthened Cu alloy can be formed.

The first diffusion-preventing layer 12 prevents diffusion of any element of the compound superconductor into the stabilizing tube 13. The layer 12 is made of an oxide of the element forming the core 11 and the stabilizing layer 13.

Figure 4:
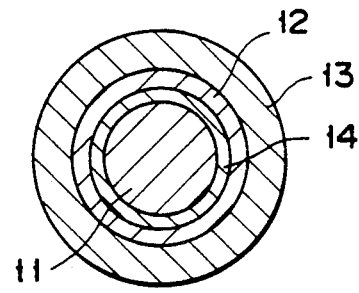

FIG. 4 illustrates a compound superconducting wire according to another embodiment of present invention. This wire is the same as the wire shown in FIG. 2, except in that a second diffusion-preventing layer 14 made of the element forming the compound superconductor surrounds the core 11 and is surrounded by the first diffusion-preventing layer 12. The first diffusion-preventing layer 12 only can prevent the element of the compound superconductor from diffusing into the stabilizing member 13. Nonetheless, the second diffusion-preventing layer 14 cooperates with the first, thereby more reliably preventing the element from diffusing into the stabilizing member 13.

According to the invention, one core 11 can be used, as shown in FIGS. 2 and 4, or two or more cores 11 can be used to form a compound superconducting wire. In the wire shown in FIG. 5, the cores 11 are located within a first diffusion-preventing tube 12, and the space between the cores 11 and the tube 12 is filled with matrix 15 made of Cu or a Cu alloy. Similarly, in the wire shown in FIG. 6, the cores 11 are located within a second diffusion-preventing layer 14, and the space between the cores 11 and the layer 14 is filled with the Cu or Cu-alloy matrix 15. Further, as is shown in FIG. 7, cores 11, each surrounded by a second diffusion-preventing layer 14, can be arranged within a first diffusion-preventing layer 12, and the space between the layers 14 and the layer 12 is filled with the Cu or Cu-alloy matrix 15. Still further, no matrix can be used, in which case the cores 11, the layer 12 and/or the layer 14, and the stabilizing member 13 are subjected to area-reduction process, whereby the cores 11 are bundled together into a unit.

FIG. 8 is a cross-sectional view of a compound superconducting wire according to another embodiment of the present invention. This wire has a strengthened Cu-alloy layer 16, which surrounds a core 11, inside a first diffusion-preventing layer 12. (The strengthened Cu alloy will be described in greater detail.) According to the invention, the strengthened Cu-alloy tube 16 can surround a diffusion-preventing layer made of metal surrounding the core 11. Further, a plurality of cores 11 can be arranged within the strengthened Cu-alloy tube 16, thereby forming a multi, compound superconducting wire.

A method of manufacturing the compound superconducting wires, which have been described, will now be explained. This method comprises the steps of: preparing a composite member comprising a superconductor-forming member (a) including compound superconductor or material which becomes a compound superconductor when heat-treated, and a stock (a) for forming a stabilizing member by heat-treatment, which is made of mainly copper and is stacked together with the core member; forming a copper oxide layer on the peripheral surface of the stabilizing member; and heat-treating the composite member in a non-oxidizing atmosphere or in an atmosphere having an oxygen partial pressure which is too low to allow the forming of a copper oxide.

The composite member used in this method can be one comprise a superconductor-forming member (a), a diffusion-preventing member made of metal and surrounding the superconductor-forming member, and a stock (b) for forming the stabilizing member surrounding the diffusion-preventing layer.

Part or whole of the stock become stabilizing member when this composite is heat-treated. The stock can be made of either pure Cu or such strengthened Cu alloy as is described above. In these cases, elements diffuses through the stock during the heat treatment, the material of the stock will not be affected much. According to the invention, the stock for forming the stabilizing member can be formed of two coaxial tubes, one made of pure Cu, and the other made of Cu alloy strengthened by an element whose oxide is more stable than a Cu oxide, or by a compound of this element. When this two-layered stock is heat-treated, it will become a three-layered one which comprises a Cu layer, a metal oxide layer, and a strengthened Cu-alloy layer.

In the case where the stock is made of high-purity copper, the heat treatment causes the solid-solution impurities in copper to react with the oxygen diffusing from the Cu-oxide thin layer formed on the stock, thus forming an oxide. This oxide and the oxide of the element contained in the superconductor-forming member and that of the element contained in the diffusion-preventing member combine, thereby forming a dense and strong diffusion-preventing layer of oxide which surrounds the superconductor-forming member or the diffusion-preventing tube surrounding the superconductor-forming member.

According to the invention, about 0.1 to 2 wt % of the element contained in the superconductor-forming member and the diffusion-preventing member of metal is dispersed in a stock made of Cu. When the composite member is heat-treated, the oxide of this element precipitate in the stabilizing member, and reinforces the stabilizing tube. As a result, the stabilizing member gains a sufficient mechanical strength.

When the stock is made of a strengthened Cu alloy, the heat treatment causes the impurities contained in the stabilizing tube to react with the oxygen diffusing from the Cu-oxide thin layer formed on the stock, thus forming an oxide. This oxide and the oxide of the element contained in the superconductor forming member or that of the element contained in the diffusion-preventing member combine, thereby forming a dense and strong diffusion-preventing layer of oxide which surrounds the superconductor forming member or the diffusion-preventing member of metal surrounding the superconductor forming member. If the element contained in the stock is A , A $_2$O$_3$, precipitates, whereby the strengthened Cu becomes a dispersion-strengthened Cu. In this case, too, the stabilizing member gains a sufficient mechanical strength.

In the case where the stock is formed of two coaxial tubes as has been explained, the heat treatment causes the solid-solution impurities in the high-purity copper including the stock to react with the oxygen diffusing from the Cu-oxide thin layer formed on the stock, thus forming an oxide. This oxide, the oxide of the element contained in the strengthened Cu alloy of the stock, and that of the element contained in the superconductor-forming member, and the element of the diffusion-preventing material combine, thus forming a dense and strong diffusion-preventing layer of oxide surrounds the strengthened Cu layer and is surrounded by the high-purity Cu layer. The strengthened Cu alloy, i.e., the material used in the stock, can be a solid-solution strengthened Cu alloy strengthened by at least one element whose oxide is more stable than copper oxide, a spinodal strengthened Cu alloy, or a dispersion strengthened Cu alloy strength by particles (e.g., $A_2O_3$). A variety of solid-solution strengthened Cu alloys can be used, such as Zr-Cu, Zr-Cr-Co-Cu, Ni-Cu, Ni-Zn-Cu, Ni-Sn-Cu, Sn-Cu, Sn-P-Cu, Ti-Cu, and T-Cu, and Be-Cu.

Of the strengthened Cu alloys, a particle-dispersion one which is obtained by sintering a mixture of copper oxide and alumna ($A_2O_3$) under a reducing atmosphere is preferred most. This alumna-containing Cu alloy still has a sufficient mechanical strength during the heat treatment performed at a temperature to form a superconducting layer. Hence, it can form a tension member of the compound superconducting wire according to the present invention. Of the solid-solution strengthened Cu alloys, 10 to 30 wt % Ni-Cu, 0.8 wt % Cr-0.2 wt % Zr-Cu, 0.5 wt % Ti-Cu, and the like are preferred for the same reason.

In any case mentioned above, the heat treatment for forming a diffusion-preventing layer of metal oxide is conducted at the same time as or, if necessary, after, the heat treatment for forming a superconducting layer. The metal oxide layer only, which has been formed during the heat treatment, suffices to prevent the elements of the superconducting layer from diffusing into the stabilizing member.

In the case where the superconductor-forming member is made of compound superconductor only, the heat treatment is carried out for only one purpose, that is, to form a diffusion-preventing layer of metal oxide. The resultant compound superconducting wire generally has the structure shown in FIG. 2.

The material, which becomes a compound superconductor when heat-treated, is Nb or Nb alloy, and Sn or Sn alloy if the compound superconductor is $Nb_3Sn$. It is Nb or Nb alloy, and A or A alloy if the compound superconductor is $Nb_3A$.

Figure 9A:
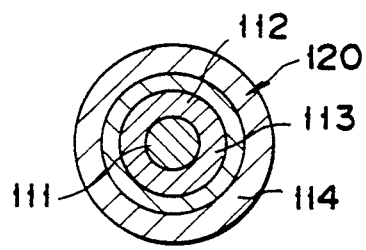
FIG. 9A is a cross-sectional view showing a composite member used in a method according to the invention, of manufacturing a compound superconducting wire.

The composite member comprising material which becomes a compound superconductor when heat-treated can be selected from the following specific ones:

(1) A composite member which comprises, as is shown in FIG. 9A, a wire 120 and a stock 114 for forming stabilizing member surrounding the wire 120 which having an Sn core 111, a Cu tube 112 surrounding the Sn core 111, and an Nb tube 113 surrounding the Cu tube 112.

Figure 9B:
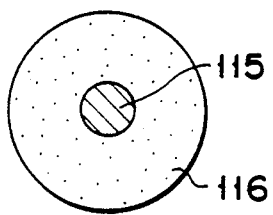
FIGS. 9B and 9C are cross-sectional views representing two core members, either being a component of a composite member used in a method according to the invention, of manufacturing a compound superconducting wire.

(2) A composite member which comprises a wire having, as is shown in FIG. 9B, an Nb core 115 and a tube 116 surrounding the Nb core 115 and made of a Cu alloy containing Sn as a solid solution element, and a stock for forming a stabilizing member (not shown) surrounding the wire, or which comprises a wire identical to the one shown in FIG. 9B, a diffusion-preventing tube (not shown) surrounding the wire, and a stock for forming a stabilizing member (not shown) surrounding the diffusion-preventing tube.

(3) A composite member which is identical to the member (1), except that a plurality of wires 120 are surrounded by the stabilizing tuber 114, or which is identical to the member (2), except that a plurality of wires (FIG. 9B) are surround by the stock for forming the stabilizing member or the diffusion-preventing tube.

(4) A composite member which comprises a plurality of wires identical to the wire of the member (2), a diffusion-preventing tube made of metal and surrounding the wires, and a stock for forming a stabilizing member surrounding the diffusion-preventing tube.

Figure 9C:
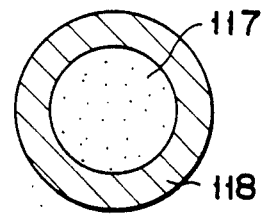

(5) A composite member which comprises a wire having, as is shown in FIG. 9C, an A -alloy rod 117 and an Nb sheath 118 surrounding the rod 117, and a stock for forming a stabilizing member surrounding the Nb sheath 118, or comprises the wire, a diffusion-preventing tube (not shown) made of metal and surrounding the wire, and a stock (not shown) surrounding the diffusion-preventing tube.

(6) A composite member which is identical to the member (5), except that a plurality of wires (FIG. 9C) are surround by the stock or the diffusion-preventing tube.

(7) A composite member which comprises a member identical to the member (6) and a stock for forming a stabilizing member surrounding the member (6).

Figure 3:
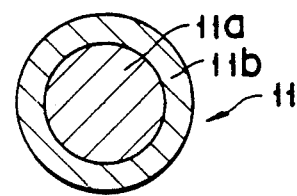

When the composite member (1) is heat-treated in a non-oxidizing atmosphere, a first diffusion-preventing tube made of metal oxide is formed, and the Sn core 111 and the copper are alloyed to form an Sn-Cu alloy. Further, the Sn in this alloy reacts with the Nb, thus forming $Nb_3Sn$, and a second diffusion-preventing tube is formed which surrounds the core 111 and is surrounded by the first diffusion-preventing tube. As a result, a compound superconducting wire having the core 11 shown in FIG. 3 and having the structure shown in FIG. 4 will be manufactured.

When the composite member (2) is heat-treated, the Sn in the Cu-alloy tube 116 and the Nb of the core 115 react with each other, forming an $Nb_3Sn$ layer. Simultaneously, a first diffusion-preventing tube made of metal oxide is formed, which surrounds the $Nb_3Sn$ layer and is surrounded by the stabilizing tube. Thus, a compound superconducting wire having the core 11 shown in FIG. 3 and having the structure shown in FIG. 2 will be manufactured.

When the composite member (5) is heat-treated, a first diffusion-preventing tube made of metal oxide is formed. At the same time, the A of the A -alloy rod 117 and the Nb of the Nb sheath 118 react with each other, thus forming an $Nb_3A$ tube is formed, which surrounds the A -alloy rod 117. Further, a second diffusion-preventing tube of Nb is formed, which surrounds the $Nb_3A$ layer. As a result, a compound superconducting wire having the core 11 shown in FIG. 3 and having the structure shown in FIG. 4 will be manufactured.

When the composite members (3), (4), (6), and (7), all having a plurality of cores, compound superconducting wires will be formed, each having at least one diffusion-preventing tube made of metal oxide.

Composite members other than those described above can be used in the present invention. A composite member of any shape and any structure can be used, provided that the surface of its stabilizing tube is exposed to oxygen. It is desirable that the ratio of the Cu in the stabilizing tube to the elements forming the diffusion-preventing tubes and superconductor range from 0.2 to 10.

When a Cu alloy is used in the composite member, it is preferred that quantity of alloyed element is controlled so as not to be hard to work. For example, an Sn-Cu alloy used in composite member (2) is hard to work even if subjected to intermediate annealing, when the Sn content is 14 wt % or more.

The Cu-oxide layer formed on the stabilizing member is made of CuO or $Cu_2O$, or a mixture of CuO and $Cu_2O$, and has a thickness of 0.1 $\mu$m to 10 $\mu$m. It is formed when the composite member is heat-treated at 100° C. to 400° C. for 1 to 120 hours in an atmosphere of the atmospheric pressure, having an oxygen concentration of 10% or more Alternatively, it can be formed when the composite member is heat-treated for 8 to 100 hours in a low-vacuum atmosphere ($1 \times 10^{-3}$ Torr to $1 \times 10^{-1}$ Torr), in which case a part of the Cu oxide diffuses into Cu.

The Cu-oxide thin layer, thus formed by oxidation, is likely to exfoliate when the heat-treated composite member is removed from the heat-treatment furnace. This is because of the difference in thermal expansion coefficient between copper and copper oxide. If the Cu-oxide thin layer exfoliates, there will be formed no oxygen source required in the subsequent heat treatment, that is, an oxide will not be dispersed uniformly enough to prevent the impurity from diffusing into the stabilizing member or to strengthen the stabilizing member sufficiently. Therefore, it is desirable that the composite member is inserted in a stainless-steel tube or a glass sleeve before the member is subjected to the oxidation within the furnace. Even a coiled composite member can be readily heat-treated if it is inserted in an electrically insulative glass sleeve. Moreover, even if a composite member is inserted in a stainless-steel tube, the oxide thin layer can be reliably formed by supplying air or a gas mixture of oxygen and an inert gas into the stainless-steel tube during the heat treatment.

The Cu-oxide thin layer can be formed by means of the chemical vapor deposition (CVD), too. It can also be formed by applying a blackening agent such as Eponol (tradename) to the stabilizing member, or by coating the stabilizing member with a paste containing a Cu-oxide.

When the Cu-oxide layer is too thin, for example less than 0.1 μm, the stabilizing member cannot have sufficient RRR (e.g., RRR=8). This is because the oxide layer contains oxygen in an amount which is too small to form a compound superconducting layer such as an $Nb_3Sn$ layer while the composite member is heat-treated in a high-vacuum, inert gas atmosphere ($1 \times 10^{-4}$ Torr or more). On the other hand, when the Cu-oxide layer is too thick, for example more than 10 μm while the wire has an outer diameter of 1 mm, or when the composite member is heat-treated in an atmosphere having a high $O_2$ partial pressure, too much oxygen enters the stabilizing member, thus forming a diffusion-preventing tube which is too thick. Consequently, the volume of the stabilizing member decreases. Also, in this case, the niobium (Nb) is oxidized, thus reducing the mechanical strength, RRR, and Jc of the wire.

Therefore, the thickness for the Cu-oxide layer should be determined in accordance with the desired RRR, the desired mechanical strength, and the desired Jc.

The composite member, now having a Cu-oxide formed on the outer periphery of the stock for forming the stabilizing member, is then heat-treated in a high-vacuum atmosphere ($1 \times 10^{-4}$ Torr or less) or in an inert gas atmosphere, thereby forming a compound superconductor. When the superconducting member is made of $Nb_3Sn$, the composite member is heat-treated at 650° to 770° C. for 10 to 400 hours. The superconducting layer is made of $Nb_3A$ , the composite member is heat-treated at 750° to 950° C. for 1 to 100 hours. During the heat treatment, oxygen is diffused into the stabilizing member and is made to react with the impurities in the member, the additive element in the member, or the elements contained in the diffusion-preventing layer.

When the stabilizing member is strengthened by one or more elements contained in layer a compound superconductor or a diffusion-preventing layer, the composite member is processed as follows: First, the composite member is subjected to a preliminary heat treatment, as is generally done in the art, in the atmosphere for 1 to 10 hours at a temperature high enough to form a compound superconductor, thereby forming a part of a compound superconductor. During the preliminary heat treatment, Sn, i.e., one of the elements for forming a compound superconductor or a diffusion-preventing tube, is diffused into the stabilizing member in an amount of 0.1 to 2.0 wt %. Then, an oxide thin layer is formed on the outer surface of the stabilizing member. Next, the composite member is heat-treated in vacuum or in a low-pressure atmosphere, or an inert-gas atmosphere, thereby forming a complete compound superconductor having sufficient super-conducting properties. During this heat treatment, oxygen is diffused into the stabilizing member, thus strengthening the stabilizing member. Simultaneously, the oxygen reacts with the surface region of the diffusion-preventing layer of metal, thereby forming an oxide. This oxide renders the diffusion-preventing layer dense and strong.

If necessary, the heat treatment for forming a Cu-oxide thin layer and the heat treatment for diffusing Sn into the stabilizing member can be performed simultaneously in the same low-vacuum atmosphere of, for example, $1 \times 10^{-1} \sim 1 \times 10^{-3}$ Torr. The stabilizing member can be made of high-purity Cu containing 0.3 wt % of oxygen. If this is the case, the step of forming the Cu-oxide thin layer can be dispensed with. That is, only one heat treatment is carried out at the superconductor-forming temperature, thereby forming a diffusion-preventing layer of oxide material.

A compound superconducting wire according to the present invention can also be manufactured by following method.

A Cu-oxide thin layer is formed on a stock for forming a stabilizing member of a composite member by the known method, or the composite member is heat-treated in the same atmosphere in which the Cu-oxide layer can be formed, whereby the impurities present in the stock as solid-solution elements, precipitate in the form of oxides, and the purity of the copper (Cu) forming a stabilizing member is increased. At the same time, the oxide can be formed on a core member including superconductor or on a diffusion-preventing layer of metal surrounding the core, thus forming another diffusion-preventing layer of oxide material which is both dense and strong. The oxygen present in the stabilizing member reacts with the niobium (Nb) of each rod, thus forming an NbO layer, during the heat treatment which is carried out at 700° C. form $Nb_3Sn$. This NbO layer prevent Tin (Sn) from leaking to the copper (Cu) of the stabilizing member.

The diffusion-preventing layer made of the metal oxide formed by the heat treatment, is not necessarily be continuous. It can be discontinuous, in which case a thermal conduction can be readily achieved between the compound superconductor and the stabilizing member.

A discontinuous diffusion-preventing layer can be made in the following way When the stock for forming the stabilizing member is made of high-purity Cu or strengthened Cu, the interface between the compound superconductor and the stock is rendered uneven. As a result, the some of the surface portions of the superconductor-forming member are near to the Cu-oxide thin layer, while the other surface portions are far from the Cu-oxide thin layer. Then, the composite member is subjected to heat treatment, during which a metal oxide precipitates only on those surface portions of the resultant superconducting layer which are near the Cu-oxide thin layer. When the stock formed of a high-purity Cu tube and a strengthened Cu tube, the interface between these two tubes is made uneven. Hence, the some of the portions of this interface are near to the Cu-oxide thin layer, while the other portions thereof are far from the Cu-oxide thin layer. Then, the composite member is subjected to heat treatment, during which a metal oxide precipitates only in those portions of the interface which are near the Cu-oxide thin layer. The interface between the superconductor forming member and the stock, or the interface between the high-purity Cu tube and the strengthened Cu tube, can easily made uneven, by way of using a stock having an uneven inner surface or a superconductor forming member having an uneven surface, or both. Even when the metal-oxide tube is thus made discontinuous, it can capture almost all element diffusing from the compound superconductor or the Nb diffusion-preventing layer toward the stabilizing member. Hence, the stabilizing member is not contaminated with the diffusing element.

If a compound superconducting wire according to the present invention is to be incorporated in a product which can be heat-treated, the heat-treatment of the present invention can be performed while the product is assembled. For example, to manufacture a superconducting coil the composite member is first wound around a mandrel and then heat-treated along with the mandrel, thereby to form a compound superconductor and a diffusion-preventing layer.

As has been described, while the composite member is being heat-treated, the oxygen in the Cu-oxide thin layer formed on the stock for forming the stabilizing member gradually diffuses into the stock and reacts with the solid-solution impurities contained in the stock or with the impurities which have diffused into the stock from the core. As a result of this, a metal oxide precipitates, thus forming a diffusion-preventing layer surrounding the core and surrounded by the stabilizing member formed by heat-treating of the stock. This layer prevents one or more elements from diffusing from the core into the stabilizing member. When the diffusion-preventing layer of metal such as Nb is formed, the oxide layer as the diffusion-preventing layer formed on the metal layer prevent impurities from diffusing from the metal layer into the stabilizing member. The increase in the electrical resistivity of the stabilizing member can thereby be suppressed, making it possible to improve the stability of the compound superconductor.

When the stabilizing member contains A as a solid-solution element, or when any element forming the superconductor or a diffusion-preventing layer of metal is diffused in the stabilizing member, the aluminum or the element will precipitate as an oxide during the heat treatment of the composite member, thus strengthening the stabilizing member, suppressing the increase in the electrical resistivity of the stabilizing member, and increasing the mechanical strength thereof.

In the case where the stock is formed of two tubes, i.e., a high-purity Cu tube and a strengthened Cu-alloy tube, a layer of oxide of the element added in the strengthened Cu alloy is formed between the two tubes. As a result, the high-purity Cu tube as the stabilizing member can have a high electrical conductivity, and the strengthened Cu-alloy tube can have a high mechanical strength.

Since the superconductor is surrounded by the oxide layer as the diffusion-preventing layer having high electrical resistance, a compound superconducting wire having low A.C. loss (coupling loss) can be obtained.

The examples of the compound superconducting wires according to the invention will now be described.

EXAMPLE 1

Figure 10:
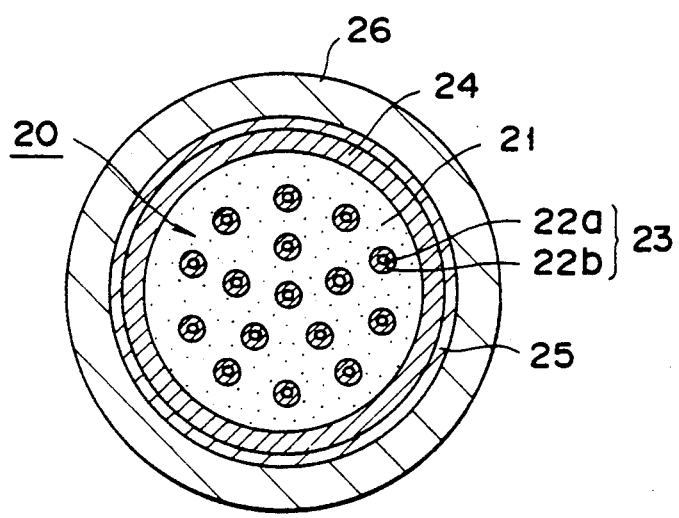
FIGS. 10 is a cross-sectional view illustrating an example of a compound superconducting wire according to the present invention.

FIG. 10 is a cross-sectional view showing the $Nb_3Sn$ superconducting wire according to this Example. As is shown in this figure, the $Nb_3Sn$ superconducting wire comprises a rod-shaped member 20, a diffusion-preventing layer 24 made of metal such as Nb and surrounding the composite member 21, a second diffusion-preventing layer 25 made of oxide of Nb, Sn, or Ti and surrounding the layer 24, and a stabilizing member 26 made of Cu and surrounding the layer 25. The member 20 comprises a Cu-Sn matrix 21 and a plurality of cores 23 embedded and distributed in the matrix 21. Each of the cores 23 is formed of a Nb wire 22a and an $Nb_3Sn$ sheath 22b covering the Nb wire 22a.

The $Nb_3Sn$ superconducting wire is different from the conventional ones in that is has the diffusion-preventing layer 25 which is made of oxide of one or more elements contained in the superconductor and/or the metal layer 24 such as Nb, Sn, or Ti and which surrounds the first diffusion-preventing layer 24 and is surrounded by the stabilizing material 26.

The compound superconducting wire is manufactured in the following way. First, a tube, as a stock for forming a stabilizing member, made of Cu, having an outer diameter of 50 mm and an inner diameter of 40 mm, is prepared. An Nb tube, which will form the first diffusion-preventing layer 24, is inserted into the Cu tube. Then, a plurality of Nb wires are arranged within the Nb tube, parallel to the axis of the Nb tube. Cu-Sn 13 wt % matrix containing 0.3 wt% of Ti is filled in the Nb tube.

Thereafter, the above-mentioned components are stacked together, thereby forming a composite member. The composite member is drawn, having its diameter reduced to a predetermine value. The composite member is heat-treated in the atmosphere at 300° C. for 48 hours, thereby forming Cu oxide (i.e., $CuO+Cu_2O$) layer on the outer surface of the Cu tube. Then, the composite member is heat-treated in a low-pressure atmosphere ($10^{-4}$ to $10^{-6}$ Torr) at 700° C. for 120 hours. During this heat treatment, the Nb wires 22a react with the Sn in the Cu-Sn matrix, forming cores 23 each comprising an Nb wire 22a and an $Nb_3Sn$ sheath 22b covering the Nb wire 22a. Also, during the heat treatment, the oxygen, which is diffusing from the Cu-oxide layer into the stabilizing tube, reacts with the Cu, thus forming the diffusion-preventing layer 25 of metal oxide. The Nb tube remains intact and serves as the diffusion-preventing tube 24 of metal. The compound superconducting wire shown in FIG. 10 is thus manufactured. The layer 25 prevents the element such as niobium (Nb) from contaminating the stabilizing member 26.

Figure 1:
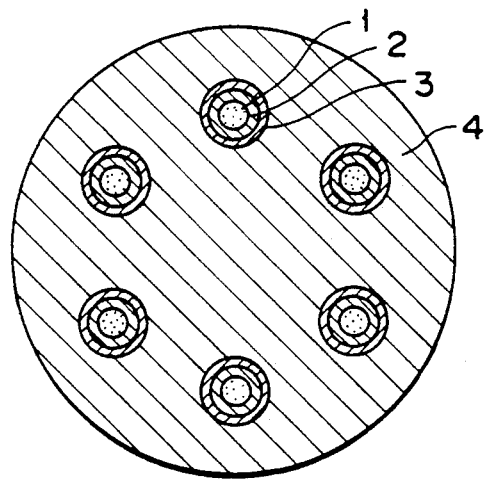
FIG. 1 is a cross-sectional view showing a conventional compound superconducting wire.

A conventional compound superconducting wire of the structure shown in FIG. 1 and a compound superconductor wire of the structure shown in FIG. 2, both having the same diameters (=0.87 mm), and the former having 264 rods, were manufactured. The RRR and resistivity $\rho$, which either wire exhibits at 20[K] and which determine the stability of the compound superconducting wire, were measured. The RRR and $\rho$ (at little above a critical temperature of $Nb_3Sn$) of the conventional compound superconducting wire were 3.3 and $6.8\times10^{-7}$ [$\Omega\cdot cm$], whereas those of Example 1 were 190 and $1.2\times10^{-8}$ [$\Omega\cdot cm$]. Obviously, Example 1 is more stable than the conventional wire. The critical current density (Jc) of either wire was also measured. The critical current density of the conventional wire was 380A/mm$^2$ at 15 Tesla, whereas that of Example 1 was 400A/mm$^2$ at 15 Tesla. Although no great difference in critical current density was observed between Example 1 and the conventional wire, the stabilizing tube 25 had a resistivity $\rho$ much higher than that of the stabilizing tube of the conventional compound superconducting wire. This is obviously because the diffusion-preventing layer 25 of metal oxide suppressed the increase in the electrical resistivity of the stabilizing member 26.

EXAMPLE 2

A tube as a stock for forming a stabilizing member made of Cu and having an outer diameter of 50 mm and an inner diameter of 40 mm was prepared. A Nb tube containing 1 wt % of Ti was inserted into the Cu tube. A rod having an outer diameter of 20 mm and formed of an Sn wire and a Cu sheath covering the Sn wire was prepared, the weight ratio of the Sn to the Cu being 0.3. This rod was inserted into the Nb tube and the rod and the Nb tube are stacked together, thereby forming a composite member. The composite member is drawn, having its diameter reduced to a predetermined value.

The composite member was heat-treated at 300° C. for 48 hours in an atmosphere in which a mixture of oxygen and an inert gas such as argon was supplied at rate of 0.1 /min, thereby forming a Cu-oxide layer having a thickness of 5 $\mu m$ on the surface of the Cu tube. Then, the composite member was heat-treated at 700° C. for 120 hours in an atmosphere in which high-purity argon was applied at rate of 0.2 /min, whereby the Nb of the Nb tube reacted with the Sn diffused from the rod. As a result, an $Nb_3Sn$ tube was formed. Simultaneously, the niobium, the titanium, and the niobium of the $Nb_3Sn$ tube reacted with the oxygen diffused from the Cu-oxide layer, thus forming a diffusion-preventing layer made of oxides (e.g., Nb oxide, Sn oxide and Ti oxide) and surrounding the Nb tube and surrounded by the stabilizing tube of Cu. Thus, a compound superconducting wire was made.

This compound superconducting wire exhibited RRR of 520 and the resistivity $\rho$ of $0.8\times10^{-8}$ [$\Omega\cdot cm$] at a temperature little above the critical temperature.

EXAMPLE 3

A compound superconducting wire of the same structure as Example 2, which also had a diffusion-preventing layer made of metal oxide and surrounding the Nb tube and surround by the Cu tube, was manufactured by the same method Example 2, except that the composite member was heat-treated at 700° C. for 48 hours in a high-vacuum ($3\times10^{-6}$ Torr). This wire exhibited RRR of 440 and resistivity $\rho$ of $0.95\times10^{-8}$ [$\Omega\cdot cm$] at a temperature little above the critical temperature.

EXAMPLE 4

A composite member identical to that used in Example 2, already having a Cu-oxide thin layer, was heat-treated at 700° C. for 120 hours in a low-pressure atmosphere ($10^{-1}$ to 10 Torr), whereby the Sn diffused into the Cu tube react with the Nb of the Nb tube, thus forming an $Nb_3Sn$ tube. At the same time, the Nb and Ti, both in the surface region of the Nb tube, and the Sn diffused from the $Nb_3Sn$ tube reacted with the oxygen diffused from the Cu-oxide thin layer, thereby forming a diffusion-preventing layer of metal oxide which surrounded the Nb tube and was surrounded by the Cu tube.

The wire of Example 4 had RRR of 210 and resistivity $\rho$ of $1\times10^{-8}$ [$\Omega\cdot cm$] at a temperature little above the critical temperature.

EXAMPLE 5

A composite member identical to that of Example 2, having no Cu-oxide thin layer yet, was inserted in a braided glass sleeve. The unit consisting of the composite member and the glass sleeve was heat-treated at 320° C. for 40 hours, thereby forming a Cu-oxide thin layer having a thickness of 6 $\mu m$ on the Cu tube. The unit was then heat-treated at 700° C. for 100 hours in a high-vacuum ($8\times10^{-6}$ Torr), whereby the Sn diffused into the Cu tube reacts with the Nb of the Nb tube, thus forming an $Nb_3Sn$ tube. Simultaneously, the Nb in the surface region of the Nb tube, the Ti, and the Sn diffused from the $Nb_3Sn$ tube reacted with the oxygen diffused from the Cu-oxide thin layer, thereby forming a diffusion-preventing layer of metal oxide which surrounded the Nb tube and was surrounded by the Cu tube. Thus, a compound superconducting wire was made.

Since the composite member was heated-treated, while inserted in the glass sleeve, the oxide thin layer did not exfoliate. Hence, the diffusion-preventing tube made of oxides of Nb, Sn and Ti could be completely formed. The wire of Example 5 had RRR of 310 and resistivity $\rho$ of $1.44\times10^{-8}$ [$\Omega\cdot cm$] at a temperature little above the critical temperature.

EXAMPLE 6

A composite member identical to that of Example 2, having no Cu-oxide thin layer yet, was inserted into a stainless-steel tube. The unit made of the composite member and the stainless-steel tube was heat-treated at 820° C. for 48 hours, while a mixture gas of oxygen and argon ($O_2$ content: 20%) was being applied into the stainless-steel tube at rate of 0.2 /min. As a result of this, a Cu-oxide thin layer having a thickness of 7 $\mu m$ was formed on the Cu tube. The unit was then heat-treated at 700° C. for 100 hours, while high-purity argon gas was being applied into the stainless-steel tube at rate of 1 /min. Whereby the Nb of the Nb tube reacted with the Sn diffused from the rod of the composite member, thus forming an $Nb_3Sn$ tube. During this heat treatment, the Nb in the surface region of the Nb tube, the Ti, and the Sn diffused from the $Nb_3Sn$ tube reacted with the oxygen diffused from the Cu-oxide thin layer, thereby forming a diffusion-preventing layer of metal oxide which surrounded the Nb tube and was surrounded by the Cu tube. Thus, a compound superconducting wire was made.

Since the composite member was heated-treated, while inserted in the stainless-steel tube, the oxide thin layer did not exfoliate. Hence, the diffusion-preventing layer made of oxides of Nb, Sn and Ti could be completely formed. The wire of Example 6 had RRR of 280 and resistivity $\rho$ of $1.6 \times 10^{-8}$ [$\Omega \cdot$cm] at a temperature little above the critical temperature.

EXAMPLE 7

A plurality of rods was prepared, which were identical to that used in Example 2, had not been heat-treated, and had a cross section of a regular hexagon. Eighty-four rods were inserted into a Cu tube as a stock for forming a stabilizing material, thus forming a unit. This unit was subjected to the known area-reduction process, thus forming a composite member having an outer diameter of 0.94 mm and a Cu ratio of 0.9, which was to be processed into a composite member for forming a 84-fine multi Nb$_3$Sn superconducting wire. This composite member was heat-treated in the atmosphere at 300° C. for 48 hours, thereby forming a Cu-oxide (CuO+Cu$_2$O) on the surface of the Cu tube.

Thereafter, the composite member was heat-treated at 700° C. for 120 hours, while reducing the pressure in the atmosphere to 2 to 3 Torr. As a result, the Nb of each Nb tube reacted with the Sn diffused from the rod surrounded by the Nb tube, thus forming an Nb$_3$Sn layer. Simultaneously, the Nb and Ti, both in the surface region of the Nb tube, and the Sn diffused from the Nb$_3$Sn tube reacted with the oxygen diffused from the Cu-oxide thin layer, thereby forming a diffusion-preventing layer of metal oxide which surrounded the Nb tube and was surrounded by the stabilizing tube. Thus, a 84-fine multifilamentary Nb$_3$Sn superconducting wire was made.

Figure 11A:
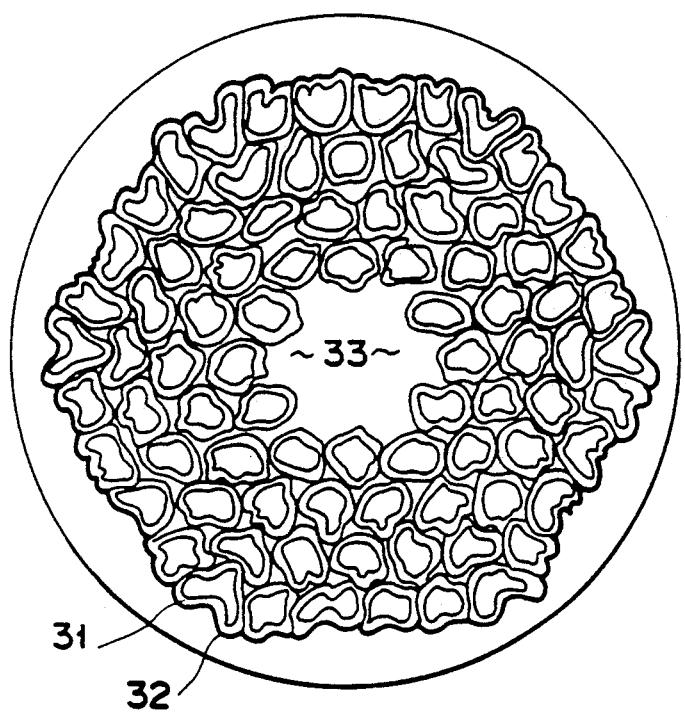
FIG. 11A is a cross-sectional view showing another example of the compound superconducting wire according to the invention.
Figure 11B:
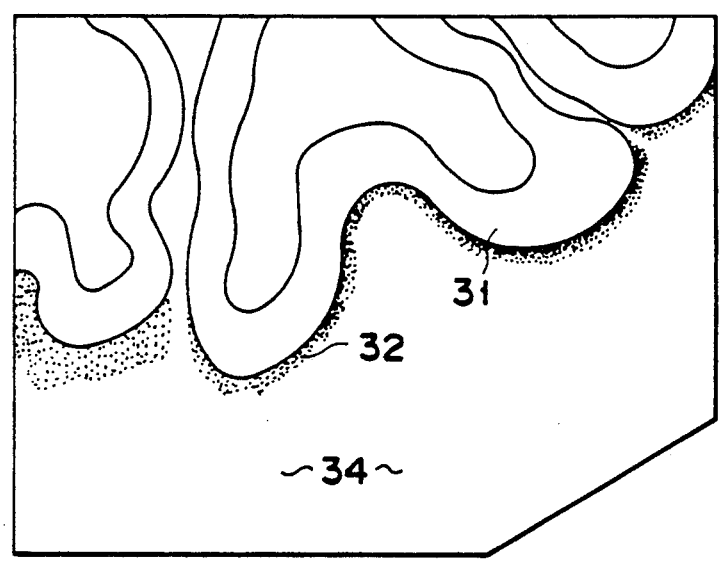
FIG. 11B is an enlarged view showing part of that example of the wire which is illustrated in FIG. 11A.

The superconducting wire of Example 7 exhibited current density Jc of 800 A/mm$^2$ at 15 Tesla, and RRR of 150. When this wire was examined under a microscope, it was found that, as is shown in FIGS. 11A and 11B, a black layer 33 had been formed at the interface between the Nb$_3$Sn layer (i.e., the outermost layer of each rod) and the stabilizing member 34 made of Cu.

This black layer 32 was subjected to secondary-ion mass spectrometry. The results of the analysis showed that the layer 32 comprising oxides of Nb, Ti, and Sn, and was a combination of the Nb tube (i.e., the diffusion-preventing tube) and the diffusion-preventing layer made of the metal oxide. In FIGS. 11A and 11B, numeral 33 denotes the Cu of the stabilizing material which had been contaminated with Sn, Ti, or Nb, whereas numeral 34 designates the Cu of the stabilizing tube which had not been contaminated Nb, Sn, or Ti owing to the black layer 32.

A control was made by the same way as Example 7, except that no oxide thin layer was formed on the Cu tube. This control had current density of 575 A/mm$^2$ and RRR of 5. When the control was examined under a microscope, it was found that, as is shown in FIGS. 12A and 12B, no black layer had been formed at the interface between the Nb$_3$Sn layer 31 and the stabilizing material 33 made of Cu. The control was subjected to secondary-ion mass spectrometry and also CMA analysis. It was found that Sn had diffused into the stabilizing tube 33 and contaminated the same.

Instead of the rods identical to that used in Example 2, use was made of aluminum rods, thus making a 84-fine multi filamentary superconducting wire in the same method as Example 7. This superconducting wire exhibited as good superconducting properties as Example 7.

Example 8

Figure 13:
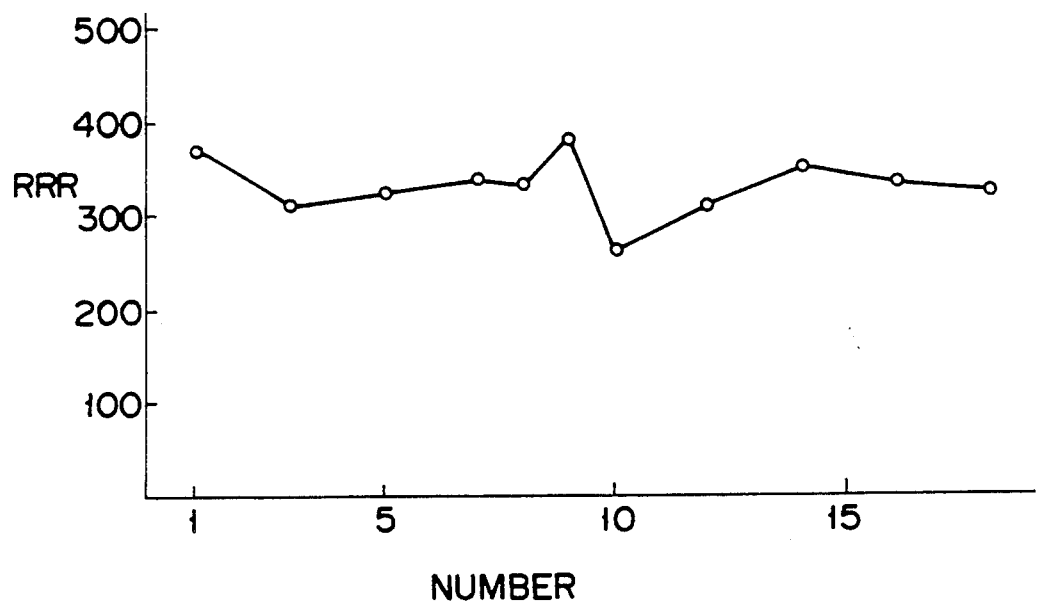
FIG. 13 is a graph representing the relationship between the RRR of a coil made of the compound superconducting wire according to the invention, on the one hand, and the number of the tubes forming the wire, on the other hand.

A composite member identical to that used in Example 7, which had an outer diameter of 0.94 mm and a Cu ratio of 0.9, and was to be processed into a composite member for forming a 84-fine multi Nb$_3$Sn superconducting wire, was wound 18 times around a mandrel made of stainless steel. The composite member, thus wound, was heat-treated at 300° C. for 48 hours in the atmosphere, thereby forming a Cu-oxide layer on the surface of the Cu tube. The composite member was further heat-treated at 700° C. for 120 hours in a vacuum of $1 \times 10^6$ Torr, thus forming an Nb$_3$Sn layer and a diffusion-preventing layer, the latter made of oxides of Sn, Ti, and Nb. Thus, a coil formed of an 84-fine multi filamentary superconducting wire was made. The RRRs of the turns of this wire were measured. The results were as is shown in FIG. 13. As can be understood from FIG. 13, the turns exhibited an average of 330 for RRR. There was found no great difference in RRR among these turns.

EXAMPLE 9

Glass cloth treated with a coupling agent was wound around a composite member identical to that used in Example 7, which had an outer diameter of 0.94 mm and a Cu ratio of 0.9, and was to be processed into a 84-fine multi-filamentary Nb$_3$Sn superconducting wire. The composite member, now covered with the glass cloth, was wound 18 times around a mandrel made of stainless steel. The composite member, thus wound, was heated at 100 to 400° C., thereby evaporating the carbon from the coupling agent, and also forming a Cu-oxide layer on the surface of the Cu tube. The composite member was further heat-treated at 700° C. for 120 hours in a vacuum of $1 \times 10^{-6}$ Torr or in an inert-gas atmosphere, thus forming an Nb$_3$Sn layer and a diffusion-preventing layer, the latter made of oxides of Sn, Ti, and Nb. The composite member was then left to stand, and was thus cooled. Thereafter, the space among the turns of the composite member were filled with epoxy resin, thus forming a coil of a 84-fine multi-filamentary superconducting wire. The RRRs of the turns of this wire were measured. The results were the same as in Example 8, that is, no great difference in RRR was found among these turns.

EXAMPLE 10

Figure 14:
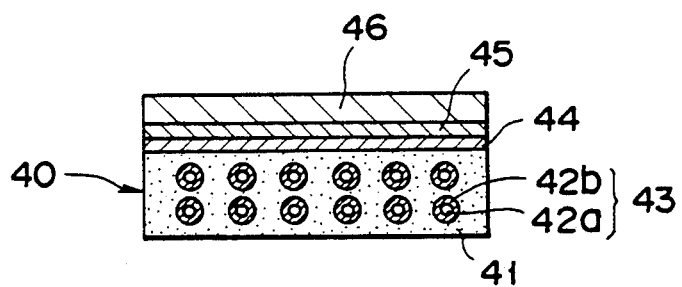

FIG. 14 is a cross-sectional view showing Example 10 of the present invention, i.e., an Nb$_3$Sn superconducting wire. As this figure shows, the wire of this example comprises a tape-shaped composite member 40, a diffusion-preventing layer 44 of metal formed on one major surface of the member 40, a diffusion-preventing layer 45 of metal oxide formed on the layer 44, and a stabilizing layer 46 formed on the layer 45. The composite member is formed of a tape-like Cu-Sn matrix 41 containing Ti and a plurality of cores 43 embedded and distributed in the matrix tape 41. Each of the cores 43 is formed of a Nb wire 42a and an Nb$_3$Sn sheath 42b covering the Nb wire 42a. The diffusion-preventing layer 44 is made of metal such as Nb, and the diffusion-preventing layer 45 is made of an metal oxide such as niolium oxide. The stabilizing layer 46 is made of Cu.

The compound superconducting wire of Example 10 is manufactured in the following way. First, a tape-shaped Cu-13 wt % Sn matrix 41 containing 0.3 wt % of Ti is prepared. Then, Nb wires 42a are arranged within the tape-shaped matrix 41, in the lengthwise direction of the matrix 41, thus forming a composite member 40. More precisely, a plurality of thinner matrix tapes are prepared, parallel grooves are then cut in the major surface of each matrix tape, next the Nb wires are laid in these grooves, and finally the matrix tapes are laid upon one another and pressed together.

Thereafter, a Nb plate to be formed the diffusion-preventing layer 44 laid upon the tape-shaped composite member 40, and the stabilizing layer 46 is laid upon the layer 44. The composite member 40, the diffusion-preventing layer 44, and the stabilizing layer 46 are first pressed and then rolled into a thin tape. This thin tape is heat-treated at 300° C. for 48 hours in the atmosphere, thus forming a Cu-oxide ($CuO + Cu_2O$) layer on the surface of the stabilizing layer 46.

Then, the tape was heat-treated at 700° C. for 120 hours in an atmosphere or an inert-gas atmosphere (e.g., an argon atmosphere), while the pressure within this atmosphere is being reduced to $1 \times 10^{-2}$ to 5 Torr. During this heat treatment, the Nb of each wire 42a reacts with the Sn contained in the Cu-Sn matrix 41, thus forming a sheath 42b of $Nb_3Sn$ on the Nb wire 42a, whereby a core 43 is formed. Also during the heat treatment, the Nb of the diffusion-preventing layer 44 reacts with the oxygen diffusing from the Cu-oxide thin layer through the Cu layer 46, thereby forming a diffusion-preventing layer 45 of metal oxide, between the diffusion-preventing layer 44 and the stabilizing layer 46.

EXAMPLE 11

Tape comprising a tape-shaped Cu-Sn alloy member, two Nb layers formed on the two surfaces of the tape, respectively, and two Cu layers formed on the Nb layers, respectively was prepared This tape was heat-treated under the same conditions as in Example 10, thereby oxidizing the surface of either Cu layer. In this example, an $Nb_3Sn$ layer was formed on the inner surface of either Nb layer, and a between either Nb layer and the Cu layer formed thereon.

EXAMPLE 12

An $Nb_3Sn$ multi superconducting wire was made in the same method as Example 7, using the same materials except that the stabilizing member was made of Cu containing 1.1 wt % of $A_2O_3$. This wire was examined under a microscope. It was found that the stabilizing member contained $A_2O_3$. This multi superconducting wire had the mechanical properties shown in the table 1, along with the mechanical properties of Example 7. The wire of Example 12 had higher mechanical properties than the wire of Example 7.

TABLE 1

| | Example 7 | Example 12 |
|---|---|---|
| Tensile Strength (kg/mm$^2$) | 33 | 47 |
| Yield Strength (kg/mm$^2$) | 27 | 37 |
| Elongation (%) | 22 | 19 |

EXAMPLE 13

A composite member identical to that used in of Example 12, having no Cu-oxide thin layer yet, was subjected to preliminary heat treatment in the atmosphere at 725° C. for 8 hours. During this heat treatment, the Sn diffused from each rod reacted with the Nb of the Nb tube, thus forming an $Nb_3Sn$ layer. Part of the Sn in the $Nb_3Sn$ layer was diffused into the Cu tube. The Sn content in the Cu tube was limited to 1 wt % or less.

The unfinished wire obtained by the preliminary heat treatment exhibited RRR of 78.5.

The wire was then inserted into a braided glass sleeve, thus forming a unit. This unit was heat-treated at 320° C. for 48 hours, thereby forming a Cu-oxide thin layer having a thickness of 9 μm on the Cu tube. The unit was further heat-treated at 700° C. for 48 hours in a vacuum ($3 \times 10^{-6}$ Torr), whereby the Sn diffused into the Cu tube reacted with the Nb of the Nb tube, thus forming an $Nb_3Sn$ layer. Simultaneously, the Nb in the surface region of the Nb tube, the Ti, and the Sn diffused from the $Nb_3Sn$ layer reacted with the oxygen diffused from the Cu-oxide thin layer, thereby forming a diffusion-preventing layer of metal oxide which surrounded the Nb tube and was surrounded by the Cu tube. Also, the Sn diffused into the Cu tube reacted with the oxygen, whereby tin oxide precipitated in the Cu tube.

The compound superconducting wire, thus made, was subjected to secondary-ion mass spectrometry. The results of this analysis proved the existence of an Sn oxide in the Cu tube. This Cu tube exhibited mechanical properties better than those of a Cu tube containing no Sn oxides. The compound superconducting wire had RRR of 151 and resistivity ρ of $3.8 \times 10^{-8}$ [Ω·cm] at a temperature little above the critical temperature.

EXAMPLE 14

FIG. 15 is a cross-sectional view showing the $Nb_3A$ superconducting wire according to this Example. As is shown in this figure, the $Nb_3A$ superconducting wire comprises a rod-shaped composite member 50, a diffusion-preventing tube 54 made of oxide of metal such as Nb, and a stabilizing member 55 made of dispersion-strengthened Cu having an $A_2O_3$ dispersion phase 56. The composite member 50 comprises an Nb matrix 51 and a plurality of cores 53 embedded and distributed in the Nb matrix 51. Each of the cores 53 is formed of an A -alloy wire 52a and an $Nb_3A$ layer 52b covering the wire 52a. This $Nb_3A$ superconducting wire is different from the conventional ones in that is has a diffusion-preventing layer which is made of the oxide of one or more elements contained in the superconductor, such as oxide of Nb, and which surrounds the Nb-matrix 51 and is surrounded by the stabilizing member 55. In this example, the Nb-matrix 51 functions a diffusion-preventing member.

The compound superconducting wire is manufactured in the following way. First, an A alloy rod containing Mg is inserted in an Nb tube, thus forming an unit. This unit is drawn, thus forming a core 53. Other identical cores 53 are made. One hundred twenty (120) cores 53 are inserted into an Nb tube. The Nb tube is inserted into a Cu tube containing A as a stabilizing member, thus forming a composite member. This composite member is drawn repeatedly, having its diameter reduced to 1 mm.

The composite member is heat-treated in the atmosphere at 300° C. for 48 hours, thereby forming Cu oxide (i.e., $CuO + Cu_2O$) on the outer surface of the tube 55. Then, the composite member is heat-treated in a non-oxidizing atmosphere, such as a vacuum ($1 \times 10^{-6}$ Torr) or an inert-gas atmosphere, at 800° C. for 3 hours. During this heat treatment, the A alloy of each rod 52a and the Nb of the matrix react, thus forming a $Nb_3A$ layer 52b covering the rod 22a. Also, during the heat treatment, the Nb diffuses into the Cu tube 55 and reacts with the oxygen in the Cu oxide diffusing from the Cu tube 55. As a result of this, Nb oxide precipitates in the peripheral region of the Nb matrix 51, thus forming a diffusion-preventing layer 54. The layer 54 suppressed the diffusion of Nb into the Cu tube 55, whereby the tube 55 maintains high Cu purity and functions as a stabilizing component.

Further, the A in the tube 55 reacts with the oxygen diffused from the Cu oxide, thus forming dispersion phase of $A_2O_3$. Hence, the tube 55 is made of dispersion-strengthened Cu.

The superconducting wire was actually made. It exhibited RRR of 170 and critical current density (Jc) of 250 A/mm$^2$ at 15 Tesla.

EXAMPLE 15

A composite member identical to that used in of Example 2, having no Cu-oxide thin layer yet, was subjected to heat treatment in a vacuum ($1 \times 10^{-3}$ Torr) at 725° C. for 3 to 100 hours. During this heat treatment, an Nb$_3$Sn layer was formed, and the residual oxygen in the furnace reacted with the Cu of the Cu tube, this forming an oxide thin layer on the surface of the Cu tube. Also, during the heat treatment, the oxygen diffusing from the oxide thin layer reacted with the Nb of the surface region of the Nb tube reacts with the Sn diffusing from the Nb$_3$Sn tube, thereby forming a diffusion-preventing layer made of oxides of Nb and Sn.

FIG. 16 represents the relationship between the RRR of the superconducting wire of Example 15 and the time of heat treatment. As this figure clearly shows, the wire made by the 48-hour heat treatment exhibited RRR of 393 and the resistivity $\rho$ of $1.38 \times 10^{-8}$ [$\Omega$·cm] at a temperature little above the critical temperature.

EXAMPLE 16

FIG. 17 is a cross-sectional view showing the Nb$_3$Sn superconducting wire according to this example. As is shown in this figure, the Nb$_3$Sn superconducting wire comprises a rod-shaped composite member 60, a diffusion-preventing layer 64 made of oxide of metal such as Nb, and a stabilizing tube 65 made of Cu. The composite member 60 comprises a Cu-Sn matrix 61 and a plurality of cores 63 embedded and distributed in the matrix 61. Each of the cores 63 is formed of an A-alloy wire 62a and Nb$_3$Sn layer 62b covering the wire 62a. This Nb$_3$Sn superconducting wire is different from the conventional ones in that, instead of an Nb or Ta diffusion-preventing layer, a diffusion-preventing layer made of the oxide of the element forming superconducting material, such as oxide of Nb, surrounds the Sn-Cu matrix rod 51 and is surrounded by the stabilizing member 65.

The compound superconducting wire of Example 16 is manufactured in the following way. First, an Nb rod is inserted into an 13 wt % Sn-Cu (bronze) tube having an outer diameter of 10 mm and an inner diameter of 5.7 mm, thus forming an unit. This unit is subjected to area-reduction process, thus forming a core having a hexagonal cross section. Other identical cores are prepared. A plurality of cores are inserted into an 13 wt % Sn-Cu (bronze) tube having an outer diameter of 50 mm and an inner diameter of 46 mm, thus forming a unit. This unit is subjected to area-reduction process, thus forming a composite member having a diameter of 2.8 mm. Oxygen-free copper as a stabilizing member is deposited on the peripheral surface of the composite member. Then, the composite member is drawn and made thinner.

The composite member, now thin, is heat-treated in the atmosphere at 200° C. for 80 hours, thereby forming Cu oxide (i.e., CuO+Cu$_2$O) on the outer surface of the Cu tube. Then, the composite member is heat-treated in a vacuum ($5 \times 10^{-6}$ Torr) or an inert-gas atmosphere, at 700° C. for 80 hours. During this heat treatment, each Nb rod 22a reacts with the Sn of the Cu-Sn matrix, thus forming a Nb$_3$Sn layer 62b on the rod 22a. Also, during the heat treatment, the Sn the Cu-Sn matrix reacts with the oxygen diffused into the Cu tube from the Cu oxide, thus forming a diffusion-preventing layer made mainly of Sn oxide. The diffusion-preventing layer suppresses the diffusion of Sn and Nb into the Cu tube 65, whereby the tube 65 maintains high Cu purity.

The superconducting wire of Example 16 was actually made. It exhibited RRR of 160 and critical current density (Jc) of 250A/mm$^2$ at 15 Tesla.

EXAMPLE 17

Figure 18:
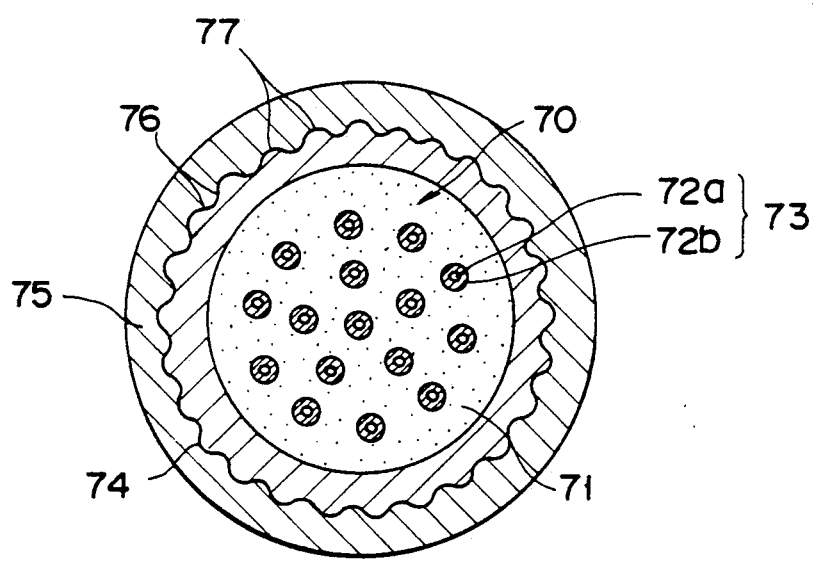

FIG. 18 is a cross-sectional view showing the Nb$_3$Sn superconducting wire according to this example. As is shown in this figure, the Nb$_3$Sn superconducting wire has a structure similar to that of Example 1. Namely, it comprises a rod-shaped composite member 70, a diffusion-preventing layer 74 made mainly of Nb, and a stabilizing member 75 made of Cu. The composite member 70 comprises a Cu-Sn matrix 71 and a plurality of cores 73 embedded and distributed in the matrix 71. Each of the cores 73 is formed of an Nb wire 72a and an Nb$_3$Sn layer 72b covering the wire 72a. The interface 76 between the diffusion-preventing tube 74 of metal and the stabilizing member 75 is waving as is evident from FIG. 18. A number of diffusion-preventing layers 77 made of an oxide of Sn or Ti are formed between the protruding portions of the layer 74 and the depressions in the inner surface of the tube 75. The superconducting wire is different from that of Example 1, in that it has, so to speak, a discontinuous diffusion-preventing layer 77.

A superconducting wire of Example 17 was actually made. It exhibited RRR of 170 and critical current density (Jc) of 250A/mm$^2$ at 15 Tesla, which are similar to those of the superconducting wire of Example 1. It was found that the stabilizing member 75 remained not contaminated, owing to the discontinuous diffusion-preventing layer 77.

Since the diffusion-preventing layer 77 was discontinuous, the thermal conduction between the Cu-Sn matrix 71, which has Nb$_3$Sn sheaths 72b, and the stabilizing member 75 was enhanced, which improved the stability of the superconducting wire further.

The discontinuous diffusion-preventing layer 77 can be formed in the following way. First, the inner surface of a Cu tube as a stock for forming the stabilizing member or the outer surface of a Nb tube for forming the diffusion-preventing layer 74 is worked and made uneven or waving. The Nb tube is then inserted into the Cu tube, thereby forming a waving interface between these tubes. Next, a Cu-oxide thin layer is formed on the outer surface of the Cu tube, as in Example 1. Thereafter, the composite member is heat-treated in a vacuum or an inert-gas atmosphere at a temperature required for forming an Nb$_3$Sn layer. As a result, metal oxide is formed between only the protruding portions of the diffusion-preventing layer 74 and the depressions in the inner surface of the tube 75, thus forming a discontinuous, diffusion-preventing layer 77 of oxide.

EXAMPLE 18

Composite members identical to that used in Example 2, not heat-treated yet, were worked into composite members having a regularly hexagonal cross section. These composite members were inserted into a Cu tube as a stock for forming a stabilizing member, thus forming a unit. Of these composite members, those arranged close to the inner surface of the Cu tube had been worked such that each had an axial groove open to the inner surface of the Cu tube. The depth of the groove from the surface of the Cu tube was of such a value that it would be reduced to 25 to 30 $\mu$ by area-reduction process.

Then, the unit consisting of the Cu tube and the composite members was subjected to area-reduction process as in Example 7, thereby forming a wire stock for forming an 84-fine multi Nb$_3$Sn wire. This wire stock was heat-treated under the same conditions as in Example 7, thus forming a Cu-oxide thin layer. Further, the wire stock was heat-treated in a low-pressure atmosphere under the same conditions as in Example 7, thus forming an Nb$_3$Sn layer. As a result, a 84-fine multi Nb$_3$Sn superconducting wire was made.

Figure 19:
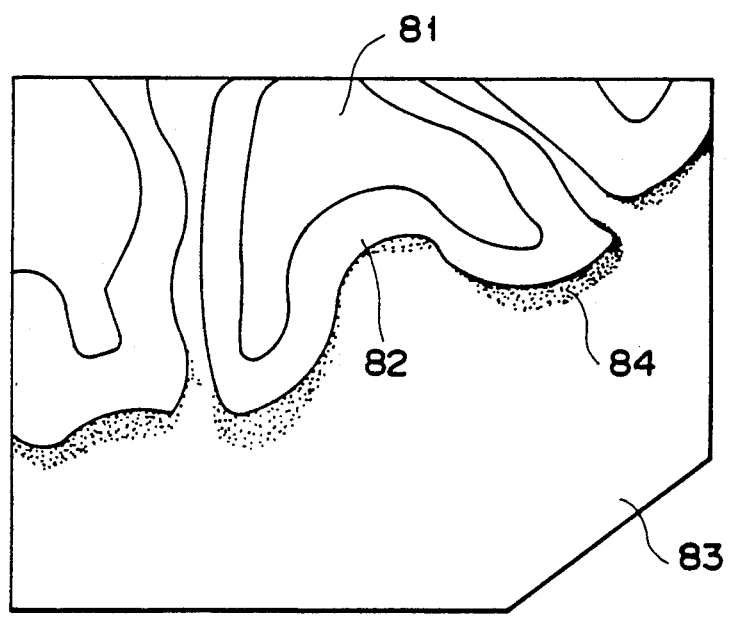
FIG. 19 is an enlarged view showing part of an example of the compound superconducting wires according to the present invention.

This superconducting wire was examined under a microscope. As is shown in FIG. 19, layers 84 of oxides of Nb, Ti, and Sn were formed between only the protruding portions of the Nb tube 82, i.e., the outermost tube of an Nb$_3$Sn layer 81, and the stabilizing member 83. These metal oxide layers 84 formed a discontinuous, second diffusion-preventing tube 77.

The superconducting wire of Example 18 exhibited RRR of 210 and critical current density (Jc) of 330A/mm$^2$ at 15 Tesla, which values are similar to those exhibited by the superconducting wire of Example 7. It was ascertained that the stabilizing member 83 was not contaminated.

EXAMPLE 19

An Nb$_3$Sn multi superconducting wire was made under the same conditions as Example 12, except that use was made of a Cu tube containing 1.1 wt % of A$_2$O$_3$ and having a waving inner surface as a stock for forming a stabilizing material.

This superconducting wire also had a discontinuous diffusion-preventing layer formed of layers of oxides of Nb, Ti, and Sn. The wire had RRR of 170, critical current density (Jc) of 530A/mm$^2$ at 15 Tesla, and tensile strength of 47 kg/mm$^2$, which values are similar to those exhibited by the superconducting wire of Example 7. It was ascertained that, owing to the discontinuous diffusion-preventing layer, the stabilizing member had not been contaminated, nor the mechanical strength thereof had been reduced.

EXAMPLE 20

An Sn wire was inserted into a sheath of oxygen-free, high-purity Cu, thus forming a composite wire. The composite wire was drawn into a wire having a diameter of 9.9 mm. Then the composite wire was inserted into Nb tube, thereby making a rod. The rod was inserted into a tube made of grain-dispersion strengthened Cu containing 1.1 wt % of A$_2$O$_3$ and having an outer diameter of 20.6 mm and an inner diameter of 1.6 mm, thereby forming a larger rod. This layer rod was inserted into a tube of oxygen-free, high-purity (99.99%) Cu, having an outer diameter of 24.7 mm and an inner diameter of 20.8 mm, thus forming a still larger rod. This rod was drawn, thereby forming a composite member having a diameter of 1 mm. The tube of grain-dispersion strengthened Cu had been made by reducing sintering a mixture of copper oxide powder and 1.1 wt % of alumina powder, in a hydrogen atmosphere.

Figure 20:
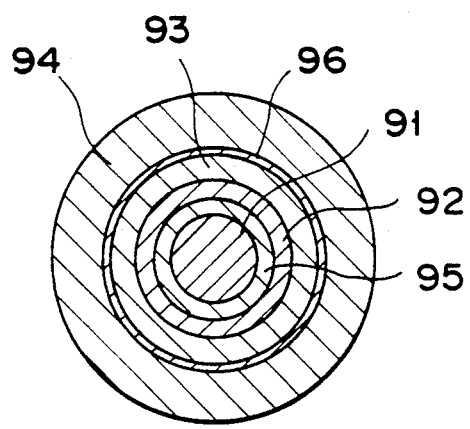
FIGS. 20 and 21 are cross-sectional views showing two other examples of the compound superconducting wires according to the invention.

The composite member was heat-treated in the atmosphere at 300° C. for 48 hours, thereby forming a Cu-oxide layer on the surface of the composite member. Further, the composite member was heat-treated in a high vacuum (3 × 10$^{-6}$ Torr) at 700° C. for 48 hours. During this heat treatment, the Nb of the Nb tube reacted with the Sn diffusing from the Sn wire, thus forming an Nb$_3$Sn layer. Also, during the heat treatment, the impurities diffusing from the Cu-alloy tube into the high-purity Cu tube reacted with the oxygen diffusing to the high-purity Cu tube, thus forming a diffusion-preventing layer made of oxides of metals such as A and Nb interposed between the grain-dispersion strengthened Cu-alloy tube and the oxygen-free, high-purity Cu tube. As a result, a superconducting wire shown in FIG. 20 was obtained. As is shown in FIG. 20, this superconducting wire comprised a Cu-Sn core 91, an Nb$_3$Sn layer 95 surrounding the core 91, an Nb layer 92 surrounding the layer 95, a grain-dispersion strengthened Cu layer 93 surrounding the Nb layer 92, a diffusion-preventing layer 96 surrounding the layer 93, and a high-purity Cu layer 94 surrounding the layer 93.

The high-purity Cu layer 94 functioned as a stabilizing member, and the grain-dispersion strengthened Cu layer 93 served as a tension member. Further, the diffusion-preventing layer 96, which surrounds the layer 93 and is surrounded by the tube 94, prevented the contamination of the oxygen-free, high-purity Cu tube 94, whereby the wire retained high electrical conductivity.

The superconducting wire, thus obtained, exhibited RRR of 380, resistivity $\rho$ of $1 \times 10^{-8}$ [$\Omega$·cm] at a temperature little above the critical temperature, and tensile strength of 47 kg/mm$^2$. The superconducting wire of Example 20 had satisfactory conductivity and also sufficient mechanical strength.

EXAMPLE 21

A superconducting wire was made under the same conditions as Example 20, except that a tube of solid-solution strengthened Cu alloy containing 30 wt % of Ni was used instead of a tube made of grain-dispersion strengthened Cu-alloy tube. This superconducting wire had RRR of 90, resistivity $\rho$ of $6 \times 10^{-8}$ [$\Omega$·cm] at a temperature little above the critical temperature, and tensile strength of 47 kg/mm$^2$. The superconducting wire of Example 21 had satisfactory conductivity and also sufficient mechanical strength.

EXAMPLE 22

Figure 21:
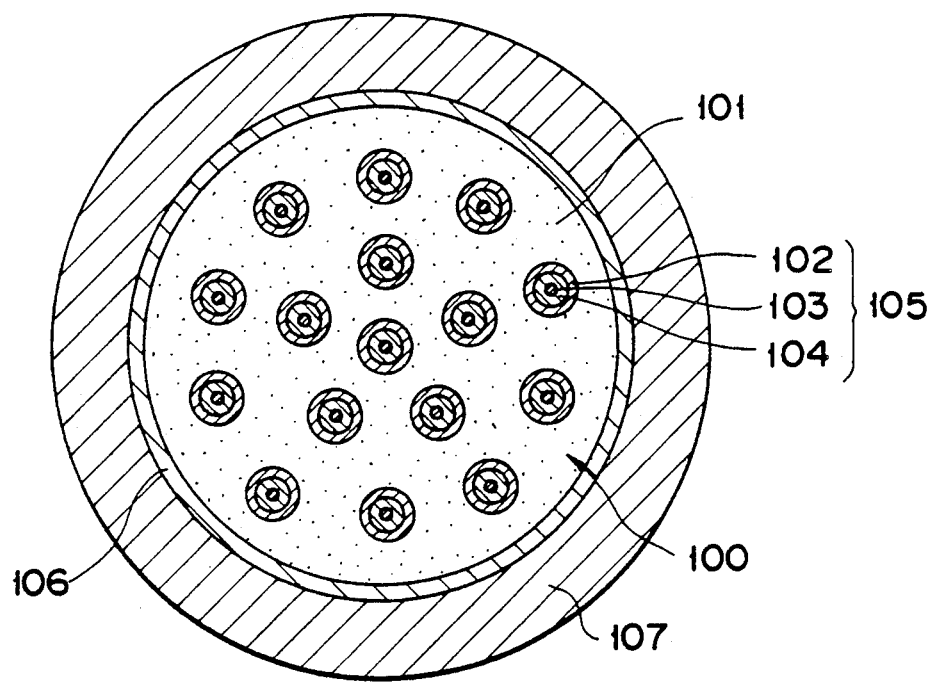

FIG. 21 is a cross-sectional view illustrating a multi superconducting wire having cores, each identical to the composite member used in Example 20, except that it had no high-purity Cu tubes. As can be understood from FIG. 21, this wire comprises a rod-shaped composite member 100, a diffusion-preventing layer 106 made of an oxide of A or Ti and surrounding the composite member 100, and a stabilizing member 107 made of high-purity Cu and surrounding the layer 106. The core member 100 is formed of a grain-dispersion strengthened Cu-alloy matrix 101 containing 1.1 wt % of A$_2$O$_3$ and a plurality of wires 105 embedded and distributed in the Cu-alloy matrix 101. Each wire 105 consists of a Cu-Sn core 103, an Nb$_3$Sn layer 104 surrounding the core 103, and an Nb layer 102 surrounding the Nb$_3$Sn tube.

The multi superconducting wire shown in FIG. 21 is manufactured in the following way. First, a rod are prepared, each identical to the composite member used in Example 20, except that it has no high-purity Cu tube, that is, each consisting of a Cu-Sn wire, an Nb tube surrounding the Cu-Sn wire, and a tube made of grain-dispersion strengthened Cu containing 1.1 wt % of A$_2$O$_3$ and surrounding the Nb tube 102. Area-reduction process is performed on the rod, thus reducing the diameter of the rod to 1 mm. Meanwhile, a tube made of grain-dispersion strengthened Cu-alloy containing 1.1 wt % of A$_2$O$_3$ and having an outer diameter of 20.6 mm and an inner diameter of 16.1 mm is inserted into a tube made of oxygen-free, high-purity Cu (99.99%) and having an outer diameter of 24.7 mm and an inner diameter of 20.8 mm, thereby forming a double-layered tube. A plurality of the rods are inserted into this double-layered tube, thus forming a unit. Area-reduction process is performed on this unit, thereby forming a composite member having a diameter of 1 mm. The composite member is heat-treated in the atmosphere at 300° C. for 48 hours, forming a Cu-oxide thin layer on the surface of the oxygen-free, high-purity Cu tube.

Thereafter, the composite member is heat-treated at 700° C. for 50 hours in a vacuum of $3 \times 10^{-6}$ Torr. During this heat treatment, Nb$_3$Sn layers are formed which surround the Nb tubes respectively, and a diffusion-preventing layer 106 made of oxide of A or Nb is formed which surrounds the Cu-alloy matrix and surrounded by the high-purity Cu stabilizing tube.

The Cu-alloy matrix 101 made of grain-dispersion strengthened Cu alloy functions as a tension member. The diffusion-preventing layer 106 made of oxide of A or Nb prevents contamination of the stabilizing member 107 made of oxygen-free, high-purity Cu.

A multi superconducting wire of Example 22 was made. This wire exhibited RRR of 130, resistivity $\rho$ of $2 \times 10^{-8}$ [$\Omega \cdot$cm] at a temperature little above the critical temperature, and tensile strength of 47 kg/mm$^2$. The superconducting wire of Example 22 had satisfactory conductivity and also sufficient mechanical strength.

EXAMPLE 23

A double-layered tube consisting of a tube made of a grain-dispersion strengthened Cu-alloy tube and an oxygen-free, high-purity Cu tube, both identical to those used in Example 20, was used instead of the Cu tube used in Example 1, thereby forming a composite member. A heat treatment for forming a Cu-oxide thin layer and a heat treatment for forming a Nb$_3$Sn layer are performed under the same conditions as in Example 20.

This superconducting wire had a diffusion-preventing layer made of oxide of A or Nb and surrounding the grain-dispersion strengthened Cu-alloy layer and surrounded by the oxygen-free, high-purity Cu layer. The stabilizing member exhibited high electrical conductivity of oxygen-free, high purity Cu.

The multi superconducting wire exhibited RRR of 180, resistivity $\rho$ of $1 \times 10^{-8}$ [$\Omega \cdot$cm] at a temperature little above the critical temperature, and tensile strength of 47 kg/mm$^2$.

EXAMPLE 24

A multi superconducting wire was made under the same conditions as in Example 22, except that use was made of a tube for forming a stabilizing tube having a waving inner surface. This wire had a waving interface between the grain-dispersion strengthened Cu-alloy matrix and the oxygen-free, high-purity Cu stabilizing member. Hence, the wire also had a discontinuous diffusion-preventing tube which was made of oxide of A or Nb and similar to that of Example 17. The stabilizing member exhibited not only high electrical conductivity, but also sufficient thermal conductivity. The multi superconducting wire of Example 24 had RRR of 130, resistivity $\rho$ of $2 \times 10^{-8}$ [$\Omega \cdot$cm] at a temperature little above the critical temperature, and tensile strength of 47 kg/mm$^2$.

EXAMPLE 25

An Nb tube containing 1 wt % of Ti was inserted into a Cu tube containing 0.08 wt % of oxygen and having an outer diameter of 50 mm and an inner diameter of 40 mm, thus forming a double-layered tube. A wire having a diameter of 20 mm and consisting of an Sn core and a Cu sheath covering the Sn core was inserted into the double-layered tube, thus forming a unit. This unit was drawn, thus forming a core. Other identical cores were prepared. The cores were worked into ones having a cross section of a regular hexagon. The cores were inserted into a Cu tube as a stock for forming a stabilizing member containing 0.06 wt % of oxygen, thus forming a unit. Area-reduction process was performed on this unit, thereby forming a composite member. A method of diffusing oxygen into copper (i.e., the material of the stabilizing member) is known, in which powder of copper oxide is added to molten copper. Another method is known, which will be explained with reference to FIG. 22. As is shown in FIG. 22, a multi Nb$_3$Sn superconducting wire 202 is fed from a drum 201 into a furnace 203. In the furnace 203, the wire 202 is heat-treated in the atmosphere at 100° to 400° C. for 10 minutes to 48 hours, thus forming a copper oxide layer on the wire 202. Then, in a furnace 204, the wire 202 is heat-treated at 500° to 700° C. for one minute to 90 minutes in an Ar atmosphere or a vacuum of $10^{-4}$ to $10^{-6}$ Torr, thus diffusing the oxygen of the copper oxide into the Cu matrix of the wire 202. Thereafter, the wire 202 is taken up around a take-up drum 205. Still another method is know, in which, as is shown in FIG. 23, a superconducting wire 211 wound around a drum 212 is heat-treated in a vacuum of $10^{-3}$ to $10^{-1}$ Torr for 500° at 700° C. for 50 to 100 hours, thus diffusing the oxygen into the Cu matrix of the wire 211.

The composite member was heat-treated in a vacuum of $3 \times 10^{-8}$ Torr at 700° C. for 70 hours.

During the heat treatment for forming an Nb$_3$Sn layer, the Nb of the Nb tube reacted with the Sn diffusing through the Cu sheathes, thus forming an Nb$_3$Sn layer. Also, Nb, Ti, and the Sn of the Sn tube reacted with oxygen diffusing through the Cu tube, thus forming a diffusion-preventing layer made of oxides of Nb, Sn, and Ti and surrounding the Nb layer and surrounded by the stabilizing tube. This diffusion-preventing layer prevented contamination of the stabilizing member.

Due to NbO and SnO, thus formed, Sn can no longer diffuse into the Cu matrix. The Sn, which has no way out, reacts with the residual Nb on the outer surface of the Sb$_3$Sn layer, thereby thickening the Sb$_3$Sn layer. Hence, the resultant compound superconducting wire has high critical current density [Jc].

Since the oxides of Nb, Sn, and Ti, which surrounded the Nb$_3$Sn tube, had high electrical resistance, the barrier between the Nb$_3$Sn tube and the Cu matrix, and also the barrier between the Nb$_3$Sn layer and the stabilizing member had high electrical resistance. Owing to these high-resistance barriers, the bonding current was reduced, thereby to minimize the AC current loss. (The "bonding current" is a current which flows through the compound superconducting filaments electrically connected by a changing magnetic field when the superconducting wire is used in a pulse magnet on which the changing magnetic field is applied.)

EXAMPLE 26

An Nb$_3$Sn cable-in-conduit conductor, which can be used as a largecurrent superconductor in a nuclear fusion furnace, was made in the following way. First, a tube of Nb containing 1 wt % was inserted into a Cu tube having an outer diameter of 50 mm and an inner diameter of 40 mm. Then, a composite wire having a diameter of 20 mm and formed of an Sn core and a Cu sheath covering the Sn core, the Sn core occupying 30 wt % of the composite wire. The composite wire was drawn, thus forming a core having a predetermined diameter. The core was processed into ones having a cross section of a regular hexagon. Other identical cores were prepared. The cores, thus worked, were inserted into a tube-like stock for forming a stabilizing member made of Cu containing 0.3 wt % of oxygen, thus forming a unit. Area-reduction process was performed on this unit, thereby forming a composite member. The composite member was twisted with a predetermined pitch, thus forming a rod for forming an Nb$_3$Sn superconducting strands Other identical rods were prepared.

The rods were heat-treated in the atmosphere at 300° C. for 48 hours, thereby forming a Cu-oxide thin layer on the surface of the Cu tube of each rod. Further, the rods were heat-treated in a vacuum of $3 \times 10^{-6}$ Torr at 580° C. for one hour, thus diffusing the oxygen from the Cu-oxide thin layer into the Cu tube of each rod.

Thereafter, a chromium layer was formed on the surface of each rod. The rods were then heat-treated in a vacuum of $3 \times 10^{-6}$ Torr at 725° C. for 20 hours. During this heat treatment, an Nb$_3$Sn layer was formed in each rod, and the oxygen diffusing through the Cu tube of each rod reacted with Ti, Nb, and Sn diffusing from the Nb$_3$Sn layer, thus forming an oxide layer for preventing impurities from diffusing into the Cu tube as a stabilizing member, thereby forming Nb$_3$Sn superconducting strands.

Several hundreds of Nb$_3$Sn strands, each having a diffusion-preventing layer of oxide and preventing impurities from diffusing into the stabilizing member, were bundled and inserted into a stainless-steel tube, thereby forming an Nb$_3$Sn cable-in-conduit superconductor. Since a chromium layer had been formed on each Nb$_3$Sn strand after the heat treatment and the diffusion of oxygen, the stabilizing member of each strand was not contaminated during the process of forming an Nb$_3$Sn layer. Thanks to the chromium layer, each Nb$_3$Sn strand had an insulative coating. Hence, the bonding current of the cable was small, and the AC-current loss of the cable was therefore reduced sufficiently.

What is claimed is:

1. A compound superconducting wire, comprising:
   a superconducting member including a compound superconductor;
   a stabilizing member made of mainly copper; and
   a diffusion-preventing layer for preventing diffusion of one or more elements of said compound superconductor into said stabilizing member, said layer consisting essentially of metal oxide and located between said superconducting member and said stabilizing member.

2. A compound superconducting wire according to claim 1, wherein said stabilizing member is made of high-purity copper.

3. A compound superconducting wire according to claim 1, wherein said stabilizing member is made of strengthened copper alloy.

4. A compound superconducting wire according to claim 1, wherein said diffusion-preventing layer contains the elements contained in said compound superconductor.

5. A compound superconducting wire according to claim 1, wherein said diffusion-preventing layer is discontinuous.

6. A compound superconducting wire according to claim 1, further comprising a second diffusion-preventing layer made of metal and located between said superconducting member and said diffusion-preventing layer.

7. A compound superconducting wire according to claim 1, wherein said superconducting member has a core having a layer of compound superconductor.

8. A compound superconducting wire according to claim 3, wherein said stabilizing member is made of dispersion-strengthened Cu alloy.

9. A compound superconducting wire according to claim 3, wherein said stabilizing member is made of solid-solution strengthened Cu alloy.

10. A compound superconducting wire according to claim 8, wherein said stabilizing member contains 0.1 to 1% by weight of at least one selected from the group consisting of A , A $_2$O$_3$, and Sn.

11. A compound superconducting wire according to claim 9, wherein said stabilizing member contains at least one element selected from the group consisting of Ti, Zr, Mg, Cr, Nb, and Ni.

12. A compound superconducting wire comprising:
    a superconducting member including a compound superconductor;
    a stabilizing member made of mainly strengthened copper; and
    a diffusion-preventing layer for preventing diffusion of one or more elements of said compound superconductor into said stabilizing member, said layer being located between said superconducting member and said stabilizing member, and comprising a plurality of layers, at least the outermost layer consisting essentially of a metal oxide layer.

13. A compound superconducting wire according to claim 12, wherein said stabilizing member is made of strengthened copper alloy.

14. A compound superconducting wire according to claim 12, wherein said stabilizing member is made of solid-solution strengthened Cu alloy.

15. A compound superconducting wire according to claim 12, wherein said diffusion-preventing layer contains the elements contained in said compound superconductor member.

16. A compound superconducting wire according to claim 12, wherein said metal oxide layer of said diffusion-preventing layer is discontinuous.

17. A compound superconducting wire according to claim 12, wherein said superconducting member has a core having a layer of compound superconductor.

18. A compound superconducting wire according to claim 13, wherein said stabilizing member contains 0.1 to 1% by weight of at least one selected from the group consisting of A , A $_2$O$_3$, and Sn.

19. A compound superconducting wire according to claim 14, wherein said stabilizing member contains at least one element selected from the group consisting of Ti, Zr, Mg, Cr, Nb, and Ni.

20. A compound superconducting wire comprising:
a superconducting member including a compound superconductor;
a stabilizing member made of mainly copper;
a diffusion-preventing layer for preventing diffusion of one or more elements of said compound superconductor into said stabilizing member, said layer consisting essentially of metal oxide and located between said superconducting member and said stabilizing member; and
a strengthened copper-alloy layer located between said diffusion-preventing layer and said superconducting member.

21. A compound superconducting wire according to claim 20, wherein said strengthened copper-alloy layer is made of a solid-solution strengthened copper alloy containing an element whose oxide is more stable than a copper oxide.

22. A compound superconducting wire according to claim 20, wherein said strengthened copper-alloy layer is made of a dispersion-strengthened copper alloy.

23. A compound superconducting wire according to claim 20, wherein said diffusion-preventing layer contains the elements contained in said compound superconductor.

24. A compound superconducting wire according to claim 20, wherein said diffusion-preventing layer is discontinuous.

25. A compound superconducting wire according to claim 20, wherein said superconducting member has a core having a superconductor layer.

26. A compound superconducting wire according to claim 25, further comprising a second diffusion-preventing layer made of metal and located between said strengthened copper-alloy layer and said superconducting member.

* * * * *